US009209196B2

(12) United States Patent
Ueda

(10) Patent No.: US 9,209,196 B2
(45) Date of Patent: Dec. 8, 2015

(54) MEMORY CIRCUIT, METHOD OF DRIVING THE SAME, NONVOLATILE STORAGE DEVICE USING THE SAME, AND LIQUID CRYSTAL DISPLAY DEVICE

(71) Applicant: Sharp Kabushiki Kaisha, Osaka-shi, Osaka (JP)

(72) Inventor: Naoki Ueda, Osaka (JP)

(73) Assignee: Sharp Kabushiki Kaisha, Osaka (JP)

(*) Notice: Subject to any disclaimer, the term of this patent is extended or adjusted under 35 U.S.C. 154(b) by 0 days.

(21) Appl. No.: 14/360,686

(22) PCT Filed: Nov. 12, 2012

(86) PCT No.: PCT/JP2012/079249
§ 371 (c)(1),
(2) Date: May 27, 2014

(87) PCT Pub. No.: WO2013/080784
PCT Pub. Date: Jun. 6, 2013

(65) Prior Publication Data
US 2014/0334227 A1    Nov. 13, 2014

(30) Foreign Application Priority Data

Nov. 30, 2011 (JP) .................................. 2011-261792

(51) Int. Cl.
*G11C 14/00* (2006.01)
*H01L 27/11* (2006.01)
(Continued)

(52) U.S. Cl.
CPC .......... *H01L 27/1104* (2013.01); *G11C 11/412* (2013.01); *G11C 13/0007* (2013.01);
(Continued)

(58) Field of Classification Search
CPC ............... G11C 14/00; G11C 14/0054; G11C 14/0063; G11C 14/0081; G11C 14/009
USPC ....................................................... 365/148
See application file for complete search history.

(56) References Cited

U.S. PATENT DOCUMENTS 6,147,922 A    11/2000  Hurst, Jr. et al.
6,775,171 B2   8/2004   Novosel et al.
(Continued)

FOREIGN PATENT DOCUMENTS

JP    01-098198 A    4/1989
JP    2006-245589 A  9/2006
(Continued)

OTHER PUBLICATIONS

Yin et al., Program/Erase Characteristics of Amorphous Gallium Indium Zinc Oxide Nonvolatile Memory, IEEE Transactions on Electron Devices, vol. 55, No. 8, Aug. 2008, pp. 2071-2077.*
(Continued)

Primary Examiner — Hoai V Ho
Assistant Examiner — Jay Radke
(74) Attorney, Agent, or Firm — Keating & Bennett, LLP

(57) ABSTRACT

The present invention provides a memory circuit including a memory element to which writing can be performed with a small current and a low voltage, i.e., low power consumption, and provides a non-volatile storage device that can easily reduce a chip size by using this memory circuit. A memory element 1 is a memory transistor having a transistor structure including a source electrode 14, a drain electrode 15, a gate electrode 11, and, a source region, a drain region, and a channel region made of a metal oxide semiconductor layer 13. The resistance property between the source and the drain shows a low resistance, and the memory transistor is changed to have an ohmic resistance property, regardless of a voltage application state of the gate electrode, by allowing a writing current with a density not less than a predetermined value to flow in the channel region to generate Joule heat. The memory circuit stores information between a state indicating the ohmic resistance property after the writing and a state indicating a current-voltage characteristic as a transistor depending upon the voltage application state to the gate electrode before the writing.

25 Claims, 32 Drawing Sheets

(51) Int. Cl.
*H01L 27/112* (2006.01)
*H01L 29/786* (2006.01)
*H01L 27/12* (2006.01)
*G11C 11/412* (2006.01)
*H01L 29/26* (2006.01)
*G11C 13/00* (2006.01)
*G11C 17/16* (2006.01)
*G09G 3/36* (2006.01)

(52) U.S. Cl.
CPC .............. *G11C14/00* (2013.01); *G11C 14/009* (2013.01); *G11C 14/0054* (2013.01); *G11C 17/165* (2013.01); *H01L 27/112* (2013.01); *H01L 27/1225* (2013.01); *H01L 29/26* (2013.01); *H01L 29/7869* (2013.01); *G09G 3/36* (2013.01); *G11C 2213/53* (2013.01)

(56) References Cited

U.S. PATENT DOCUMENTS

| | | | |
|---|---|---|---|
| 2003/0103045 A1* | 6/2003 | Shiraishi | 345/204 |
| 2006/0197082 A1 | 9/2006 | Cho et al. | |
| 2009/0290404 A1* | 11/2009 | Kaneko et al. | 365/145 |
| 2010/0172170 A1 | 7/2010 | Tamai et al. | |
| 2010/0208512 A1* | 8/2010 | Ueda | 365/148 |
| 2010/0232227 A1* | 9/2010 | Lee | 365/185.19 |
| 2011/0168967 A1 | 7/2011 | Ikeda | |
| 2011/0182108 A1 | 7/2011 | Williams et al. | |
| 2012/0268980 A1 | 10/2012 | Awaya et al. | |

FOREIGN PATENT DOCUMENTS

| | | |
|---|---|---|
| JP | 2008-306157 A | 12/2008 |
| JP | 2010-153591 A | 7/2010 |
| JP | 2011-171771 A | 9/2011 |
| JP | 2011-233551 A | 11/2011 |
| WO | 2009/028426 A1 | 3/2009 |
| WO | 2010/074689 A1 | 7/2010 |

OTHER PUBLICATIONS

Official Communication issued in International Patent Application No. PCT/JP2012/079249, mailed on Dec. 11, 2012.

Kothandaraman et al., "Electrically Programmable Fuse (eFUSE) Using Electromigration in Silicides", IEEE Electron Device Letters, vol. 23, No. 9, Sep. 2002, pp. 523-525.

Wang et al., "Flexible Resistive Switching Memory Device Based on Amorphous InGaZnO Film With Excellent Mechanical Endurance", IEEE Electron Device Letters, vol. 32, No. 10, Oct. 2011, pp. 1442-1444.

Fan et al., "Indium—Gallium—Zinc—Oxide Based Resistive Switching Memory for System-on-Glass Application", Proceedings of the International Display Workshops, 18th, vol. 2, 2011, pp. 575-577.

* cited by examiner

|  | Vout | |
| --- | --- | --- |
| Vin | Before writing (First state) | After writing (Second state) |
| H | Vss(L) | Vss(L) |
| L | Vdd−Vth(H) | Vss(L) |

Fig. 19

| | | Vout | |
|---|---|---|---|
| Vin | ROMB | Before writing (First state) | After writing (Second state) |
| H | H | Vss(L) | |
| L | H | Vdd−Vth(H) | |
| H | L | Vdd−Vth(H) | Vss(L) |
| L | L | Vdd−Vth(H) | |

For INVERTER (rows 1-2)
For ROM Read (row 3)

Fig. 21

| Vin | ROMB | Vout | |
|---|---|---|---|
| | | Before writing (First state) | After writing (Second state) |
| H | H | Vss(L) | |
| L | H | Vdd−Vth(H) | |
| H | L | Vdd−Vth(H) | Vss(L) |
| L | L | Vdd−Vth(H) | |

For SRAM {first two rows}

For ROM Recall {third row}

Fig. 24

MEMORY CIRCUIT, METHOD OF DRIVING THE SAME, NONVOLATILE STORAGE DEVICE USING THE SAME, AND LIQUID CRYSTAL DISPLAY DEVICE

CROSS-REFERENCE TO RELATED APPLICATIONS

This application is a National Phase filing under 35 U.S.C. §371 of International Application No. PCT/JP2012/079249 filed on Nov. 12, 2012, and which claims priority to Japanese Patent Application No. 2011-261792 filed on Nov. 30, 2011.

TECHNICAL FIELD

The present invention relates to a memory circuit including a memory element that can hold information in a non-volatile manner, and a method of using the memory element, and more particularly to a method of using the memory element for a non-volatile storage device.

BACKGROUND ART

Currently, an eFUSE element disclosed in Non-patent Document 1 described below and an insulating film breakdown type element disclosed in Patent Document 1 have been known as a memory element that can be used as a ROM (Read Only Memory).

The memory element disclosed in Non-patent Document 1 is configured as a resistance element having a stacked structure of a polysilicon/silicide/silicon nitride film that is the same as a wiring structure employed in a normal logic LSI process, with two terminals which are a cathode and an anode. A large current is flown through the resistance element for heating, an atom of a material for a metal wire is migrated or melted in a direction of an electron flow to cause breakdown, and then a resistance value between two terminals is changed. In addition, there is an example in which a resistance value is changed by externally entering a laser beam, instead of flowing a large current, to break down a wire.

The memory element (anti-fuse) disclosed in Patent Document 1 has a MOS transistor structure. It performs writing by causing dielectric breakdown that is generated by an application of high electric field to a gate insulating film As another example, an element utilizing a property of a variable resistance element is disclosed in Patent Documents 2 and 3. The element disclosed in Patent Document 2 is a transistor element including first and second conductive layer patterns (corresponding to a source electrode and a drain electrode) spaced apart on an insulating film, a physical property transformation layer formed on the insulating film between the conductive layer patterns, a high dielectric film (corresponding to a gate insulating film) stacked onto the physical property transformation layer, and a gate electrode formed on the high dielectric film. When a voltage between the source and drain exceeds a first threshold voltage in the case where an applied voltage to the gate electrode is 0 V, the resistance of the physical property transformation layer is reduced, whereby the element is set to a conducting state. On the other hand, when a predetermined voltage higher than 0 V is applied to the gate electrode, a channel is formed below the physical property transformation layer. Therefore, when the voltage between the source and drain exceeds a second threshold voltage that is lower than the first threshold voltage, the element is set to a conducting state. Accordingly, the element can be used as a switching element that switches the conducting state and a non-conducting state depending upon the application state of the gate voltage by setting the voltage between the source and drain to the voltage between the first threshold voltage and the second threshold voltage.

The element disclosed in Patent Document 3 is a 3-terminal variable resistance element including first and second electrodes (corresponding to a source electrode and a drain electrode), a variable resistance body electrically connected to both of the first and second electrodes, and a control electrode that is opposite to the variable resistance body via a dielectric layer (corresponding to a gate insulating film). When a reading voltage is applied between the first and second electrodes with a voltage being applied to the control electrode, a resistance property between the first and second electrodes shows temporarily reduced resistance, whereby a large reading current can be obtained by a low reading voltage, and a reading margin can be set large.

PRIOR ART DOCUMENT

Patent Document

Patent Document 1: U.S. Pat. No. 6,775,171
Patent Document 2: Japanese Patent Application Publication No. 2006-245589
Patent Document 3: Japanese Patent Application Publication No. 2010-153591

Non-Patent Document

Non-Patent Document 1: C. Kothandaraman, et al., "Electrically Programmable Fuse (eFUSE) Using Electromigration in Silicides", IEEE ELECTRON DEVICE LETTERS, Vol. 23, No. 9, pp. 523-525, 2002

DISCLOSURE OF THE INVENTION

Problems to be Solved by the Invention

The eFUSE element disclosed in Non-patent Document 1 is fused by allowing a large current to flow. Therefore, a variation in the resistance value of the fused element after writing is great. Since the fuse material is melted and broken by being heated to a high temperature, the melted material might scatter to a surrounding area, or the adjacent material might be deformed by an application of heat to the element. Therefore, a high-density circuit cannot be arranged around the element, which entails an increase in a chip size when a non-volatile storage device is configured with this element.

On the other hand, the memory element disclosed in the Patent Document 1 performs writing by breakdown of an insulating film. Therefore, the memory element needs an application of high voltage to the gate electrode. Because of this, a peripheral circuit used for writing becomes large to realize high breakdown voltage, which entails an increase in a chip size when a non-volatile storage device is configured with this memory element.

In view of the problems described above, an object of the present invention is to provide a memory circuit including a memory element that can perform writing with a small current and a low voltage, i.e., with low power consumption, and a method of driving the memory circuit, and further provides a non-volatile storage device that can easily realize a reduction in a chip size.

Another object of the present invention is to provide an electronic device, particularly a liquid crystal display device utilizing the compact and low power consumption non-volatile storage device.

Still another object of the present invention is to provide a memory circuit that can be used as a logic circuit that can change a combination of an output logical value and an input logical value depending upon a memory state of the memory element by utilizing the characteristic of the memory element.

Means for Solving the Problem

To achieve the objects, according to a first aspect, a memory circuit of the present invention includes a memory transistor having a transistor structure, including a source electrode, a drain electrode, and a gate electrode; and a source region, a drain region and a channel region each configured by a metal oxide semiconductor, wherein the memory transistor holds either one of a first state and a second state in a non-volatile manner, the first state indicating that a current flows depending upon a voltage application state of the source electrode and the drain electrode of the transistor structure with a current-voltage characteristic depending upon a voltage application state of the gate electrode of the transistor structure, and the second state indicating an ohmic resistance property relative to a voltage applied to the source electrode and the drain electrode, regardless of the voltage application state of the gate electrode, and the resistance property between the source and the drain region transitions to a lower resistance, and the state of the memory transistor is changed from the first state to the second state by the current flowing between the source region and the drain region of the transistor structure.

The memory circuit according to the first aspect of the present invention has a memory transistor that includes a general transistor structure and holds information in a nonvolatile manner depending upon a state of the metal oxide semiconductor in the channel region of the transistor structure. The memory transistor makes a general transistor action in the first state in which a current flowing between the source and the drain changes depending upon the voltage application state to the gate electrode, but in the second state, the memory transistor exhibits ohmic resistance property that is not dependent upon the voltage application state to the gate electrode.

Although the reason why the memory transistor is changed from the first state to the second state is still being elucidated, it is considered that this change is caused by a change in a composition ratio of elements forming the metal oxide semiconductor in the channel region due to Joule heat generated by the current flowing between the source region and the drain region of the transistor structure. It is especially considered that the diffusion of the component elements (e.g., oxygen) in the metal oxide semiconductor forming the channel region is induced by the Joule heat generated by the current flowing through the channel region, and as a result of the diffusion of the component substance to the outside of the channel region, the stoichiometric composition of the metal oxide semiconductor in the channel region is changed, whereby the resistance is reduced.

In the description below, the action of changing the memory transistor from the first state to the second state is referred to as "writing". Upon the writing, the memory transistor does not need to flow a great current for fusing an element as in the eFUSE memory element described in Non-patent Document 1. Further, the memory transistor does not need to apply a high voltage for breaking an insulating film as in the memory element described in the Patent Document 1. Accordingly, the memory transistor can perform writing with a low voltage and a small current, i.e., with low power consumption.

The element described in the Patent Document 2 or 3 has a transistor structure similar to the present invention. However, the invention described in the Patent Document 2 or the Patent Document 3 is used as a switching element or used to increase a reading margin of a memory cell by utilizing a gate voltage dependence of a resistance value of a variable resistance body that is a semiconductor. The invention in the Patent Document 2 or the Patent Document 3 is based upon a technical idea different from the present invention in that the element in the Patent Document 2 or 3 does not have a state of exhibiting ohmic characteristic regardless of the application state of the gate voltage as in the second state in the present invention.

It is preferable that, in the memory circuit according to the first aspect of the present invention, the metal oxide semiconductor is formed by containing In element, Ga element, or Zn element.

It is also preferable that, in the memory circuit according to the first aspect of the present invention, the metal oxide semiconductor is formed by containing IGZO (InGaZnOx).

FIG. 7 illustrates a change (transfer characteristic) of a current between the source and the drain to the gate voltage in the memory circuit including the memory transistor utilizing IGZO as the metal oxide semiconductor according to the present invention, as a ratio of the current flowing between the source and the drain in the first state to the current flowing in the second state. As stated above, the current flowing in the second state was almost constant regardless of the gate voltage. Accordingly, the change in the current ratio in FIG. 7 reflects the change in the current between the source and the drain in the first state.

It is understood from FIG. 7 that the ratio of the change in the resistance of about $10^8$ is obtained between the first state and the second state by applying the gate voltage by which the memory transistor becomes the off state in the first state. Therefore, the memory circuit that can easily determine the first state or the second state and that can easily perform reading can be realized by using this memory transistor as the memory element.

FIG. 8 is a graph illustrating a change in the current between the source and the drain to the voltage applied between the source and the drain in the second state in the memory transistor illustrated in FIG. 7. It is understood from FIG. 8 that the current between the source and the drain to the voltage applied between the source and the drain exhibits linear ohmic current-voltage characteristic. Accordingly, it is understood from FIGS. 7 and 8 that in the second state, the current control property as the transistor is lost, and the electric conductive property as a conductor is exhibited.

Examples of usable materials as the metal oxide semiconductor include NiO, $SnO_2$, $TiO_2$, $VO_2$, $In_2O_3$, and $SrTiO_3$, in addition to IGZO.

According to a second aspect, in the memory circuit according to the first aspect of the present invention, the transistor structure includes, in the vicinity of the channel region, an oxygen absorption layer to fix oxygen, which has moved to an outside of the channel region in the metal oxide semiconductor.

The memory circuit according to the second aspect of the present invention includes the oxygen absorption layer. Therefore, the memory circuit increases the diffusion speed of oxygen, and allows oxygen diffused from the channel region to stay in the oxygen absorption layer, thereby being capable of preventing the movement of oxygen into the channel region by additional heating. Accordingly, the memory circuit can prevent the resistance value in the second state from varying.

It is only necessary that the oxygen absorption layer is provided near the channel region, e.g., on the oxygen diffusion path in the channel region. An oxygen absorption layer may separately be provided, or a channel etch stopper film or a gate insulating film used in a manufacture of a thin-film transistor may be used as an oxygen absorption layer.

In the memory circuit according to the first or the second aspect of the present invention, the transistor structure can be a thin-film transistor.

According to a third aspect, in the memory circuit according to the first or second aspect of the present invention, the transistor structure includes a channel narrow region by which a density of a current flowing between the source region and the drain region becomes the maximum.

According to a fourth aspect, in the memory circuit according to any one of the first to third aspects of the present invention, a channel length of the transistor structure is smaller than the width of the gate electrode extending at an outside the channel region.

According to a fifth aspect, in the memory circuit according to any one of the first to fourth aspects of the present invention, the gate electrode extends in one direction beyond the channel region in a specified first direction, the gate electrode extending beyond the channel region in a direction other than the one direction, but not connected to the other elements.

In the memory circuit according to any one of the third to fifth aspects of the present invention, the memory transistor has the optimized layout of the transistor structure in order to increase the current flowing through the channel region and in order to allow the generated Joule heat to be effectively used for writing. Thus, the memory circuit can efficiently perform writing by using the Joule heat generated in the channel region, thereby being capable of performing the writing from the first state to the second state with a small current.

When the channel width of the transistor is defined as W, and the channel length is defined as L, the writing current Ipp flowing through the channel of the transistor is expressed by Equation 1 described below in a saturated region. In Equation, $\mu$ is a mobility of the metal oxide semiconductor, Cox is an electrostatic capacitance of the gate insulating film, Vgs is a voltage between the gate and the source, and Vth is a threshold voltage of the transistor.

$$Ipp/W = (1/2) \cdot \mu Cox/L \cdot (Vgs - Vth)^2 \quad \text{[Equation 1]}$$

On the other hand, a quantity of heat generated in the channel region per unit time is represented by $Pw = Vds \cdot Ipp$, wherein the voltage between the source and the drain is defined as Vds.

Accordingly, in order to maximize the quantity of heat generated in the channel region,
(1) the channel length L is minimized.
(2) the channel width W is increased.
As the channel width W is increased, the quantity of heat generated in the channel region increases, so that the writing can be performed with higher speed. However, the increase in the channel width W entails an increase in the area of the memory element. Therefore, it is preferable that the channel width W is optimized to a value as narrow as possible within a range by which the writing can be performed with sufficient high speed.

Further, in order to allow the quantity of heat generated in the channel region to efficiently contribute to the temperature rise of the metal oxide semiconductor in the channel region, the memory circuit preferably satisfies the conditions (3) to (6) described below as a request from the viewpoint of a thermal circuit.

(3) The capacity of heat in the channel region is minimized.
(4) The thermal conduction from the channel region to the other region via the metal oxide semiconductor is minimized.
(5) The heat capacity of the gate electrode is minimized.
(6) The thermal conduction via the gate electrode is minimized.

The memory element according to the present invention can satisfy the conditions (3) and (4), by including the channel narrow region so that the channel width in the channel narrow region is set to be smaller than the width of the source region and the width of the drain region.

The memory element can satisfy the condition (5) by further narrowing the width of the gate electrode in the channel region crossing the metal oxide semiconductor. In general, the width of the gate electrode in the channel region coincides with the channel length. This is equivalent to the case in which the channel length of the transistor is designed to be narrower than the width of the gate electrode outside the channel region.

It is also configured such that the gate electrode extends beyond the channel region in only one specific direction to be connected to a wiring that connects the elements, while the gate electrode extends beyond the channel region by a margin necessary due to the layout design but does not extend in an amount over this margin in the other direction. With this configuration, the memory element can satisfy the condition (6).

According to a sixth aspect, the memory circuit according to any one of the first to fifth aspects of the present invention includes a series circuit formed by connecting in series a selection transistor to a memory element formed by the memory transistor.

According to a seventh aspect, the memory circuit according to the first or second aspect of the present invention includes a series circuit formed by connecting two of the memory transistors in series, wherein
one of the memory transistors forms a memory element, and the other memory transistor forms a selection transistor, and
a state of the memory transistor forming the selection transistor is fixed to the first state.

The memory circuit according to the sixth or seventh aspect of the present invention can be configured by connecting a transistor for selecting a cell to a memory transistor in series.

The selection transistor can be made of the memory transistor according to the present invention. Notably, when the memory transistor is used as the selection transistor, the memory state of the memory transistor is not changed from the first state to the second state (i.e., the writing is not performed), but is fixed to the first state in which the memory transistor operates as the transistor.

In this case, the memory transistor used as the selection transistor can be formed with the same process as the memory transistor used as the memory element. Therefore, a separate process of forming the selection transistor is not needed, whereby the manufacturing process is simplified and facilitated.

According to an eighth aspect, in the memory circuit according to the seventh aspect of the present invention, a ratio of a channel width to a channel length of the memory transistor forming the selection transistor is larger than a ratio of a channel width to a channel length of the memory transistor forming the memory element.

According to a ninth aspect, in the memory circuit according to the seventh or eighth aspect of the present invention, a threshold voltage of the memory transistor forming the selection transistor in the first state is lower than a threshold voltage of the memory transistor forming the memory element in the first state.

According to a tenth aspect, in the memory circuit according to any one of the seventh to ninth aspects of the present invention, the drain electrode of the memory transistor forming the memory element that is one end of the series circuit is connected to a higher voltage side than the source electrode of the memory transistor forming the selection transistor that is the other end of the series circuit.

Since the memory transistor forming the selection transistor is connected in series to the memory transistor forming the memory element, it is necessary that the memory transistor forming the selection transistor is not written by the current flowing upon the writing of the memory transistor forming the memory element. In the description below, the "memory transistor forming the memory element" is merely referred to as "memory element", and the "memory transistor forming the selection transistor" is merely referred to as "selection transistor" in some cases.

As described above, the quantity of heat generated in the channel region of each memory element is represented by a product of the voltage Vds applied between the source and the drain and the writing current Ipp. The current flowing through the memory element and the current flowing through the selection transistor are the same, since the memory element and the selection transistor are connected in series. Therefore, the quantity of heat generated in the channel region of each memory transistor is determined by the voltage Vds applied between the source and the drain of each memory transistor. In order to prevent the selection transistor from being written when the writing current Ipp flows through the memory element, it is necessary that the voltage Vds between the source and the drain, which is distributed to the selection transistor, may become lower than the voltage Vds between the source and the drain, which is distributed to the memory element. In other words, the design parameters for the transistor structure of each memory transistor or the voltage application condition may be set in order that the on resistance of the selection transistor in the first state becomes smaller than the on resistance of the memory element in the first state during the writing action.

Specifically, for example, (1) the ratio (W/L) of the channel width W to the channel length L of the transistor structure of the selection transistor is set to be larger than the ratio of the memory element. In general, the on resistance of the transistor is proportional to the channel length L but inversely proportional to the channel width W. Therefore, the on resistance of the selection transistor can be reduced to less than the on resistance of the memory element.

(2) The threshold voltage of the transistor structure of the selection transistor in the first state is set to be lower than the threshold voltage of the memory element.

Alternatively, (3) the gate voltage applied to each memory transistor may be set such that the voltage Vgs applied between the gate and the source of the selection transistor becomes higher than the voltage applied between the gate and the source of the memory element during the writing of the memory element as described below.

If the source electrode of the memory element and the drain electrode of the selection transistor are connected in series to form a memory cell, the source electrode of the selection transistor is connected to a low-voltage side (e.g., grounded), and the writing voltage is applied from the drain electrode side of the memory element, the voltage Vgs applied between the gate and the source of the memory transistor forming the selection transistor is higher than the voltage Vgs applied between the gate and the source of the memory transistor forming the memory element by the voltage Vds, which is distributed to the selection transistor, between the source and the drain, even if the same voltage is applied to the gate electrodes of both memory transistors.

Therefore, in the memory circuit according to any one of the eighth to tenth aspects, the on resistance of the selection transistor in the first state is set to be smaller than the on resistance of the memory element in the first state, whereby the unintentional writing to the memory transistor used as the selection transistor can be prevented during the writing of the memory transistor forming the memory element. Accordingly, the deterioration in the function as the selection transistor can be prevented.

According to an eleventh aspect, the memory circuit according to any one of the first to fifth aspects of the present invention further includes a series circuit formed by connecting a memory element formed by the memory transistor to a load circuit in series, wherein one end of the series circuit is connected to a high-level reference voltage and the other end is connected to a low-level reference voltage, and a voltage outputted on a connection node of the memory element and the load circuit is changed depending upon a voltage inputted to the gate electrode of the memory element.

In the memory circuit according to the eleventh aspect of the present invention, a transistor forming an inverter circuit is replaced by the memory transistor of the present invention. With this configuration, a memory circuit that changes an output voltage depending upon a memory state of the memory transistor can be realized.

According to a twelfth aspect, in the memory circuit according to any one of the first to fifth aspects of the present invention, one end of a series circuit in which a memory element formed by the memory transistor is connected to a switching transistor in series and one end of a load circuit are connected to each other, one of the other end of the series circuit and the other end of the load circuit is connected to a high-level reference voltage, and the other is connected to a low-level reference voltage, and a voltage outputted on a connection node of the series circuit and the load circuit is changed in accordance with a voltage inputted to the gate electrode of the memory element and a gate voltage inputted to the switching transistor.

In the logic circuit according to the twelfth aspect of the present invention, the memory transistor according to the present invention is inserted into either one of the switching transistor forming the inverter circuit and the load circuit. With this configuration, a memory circuit that can change an output voltage depending upon the memory state of the memory transistor can be realized.

In the memory circuit according to the eleventh or twelfth aspect of the present invention, preferably, the load circuit is configured with a transistor, and a predetermined fixed voltage for turning on a load transistor, which is the transistor forming the load circuit, is inputted to a gate electrode of the load transistor.

In the memory circuit according to the eleventh or twelfth aspect of the present invention, preferably, the load transistor is the memory transistor, and a memory state of the load transistor is fixed to the first state.

According to a thirteenth aspect, the memory circuit according to any one of the first to fifth aspects of the present invention includes two sets of series circuits in which a switching transistor is connected in series to a memory element formed by the memory transistor; and a SRAM circuit in which a drain terminal of the switching transistor of one of the series circuits and a gate terminal of the switching transistor of the other series circuit are connected to each other, wherein a memory state of the SRAM circuit is changed to a memory state held in the memory element by applying, to the gate electrode of the memory element, as an input, a low-level voltage by which the transistor structure becomes in an off state if the memory element is in the first state.

In the memory circuit according to the thirteenth aspect of the present invention, the memory transistor according to the present invention is incorporated into the SRAM circuit. Accordingly, the memory circuit can be used such that the memory state of the memory element is transferred to the SRAM circuit just after a power is turned on or just after the power is returned from the power off, and then the memory element is used as a normal SRAM element.

To achieve the objects, a method of driving the memory circuit according to the present invention is a method of driving the memory circuit according to any one of the first to sixth aspects of the present invention.

According to a first aspect, the method includes:

a step of turning on the transistor structure by applying a predetermined voltage to the gate electrode of the memory transistor in the first state; and a step of applying a voltage, which is necessary for writing to change the memory transistor from the first state to the second state, between the drain electrode and the source electrode of the memory transistor.

To achieve the objects, a method of driving the memory circuit according to the present invention is a method of driving the memory circuit according to any one of the first to fifth aspects of the present invention.

According to a second aspect, the memory circuit includes a series circuit formed by connecting a selection transistor to a memory element in series, the memory element formed by the memory transistor, and the method includes:

a step of turning on the transistor structure by applying a predetermined voltage to the gate electrode of the memory transistor in the first state;

a step of turning on the selection transistor by applying a predetermined voltage to a gate electrode of the selection transistor, and a step of applying a voltage, which is necessary for writing to change the memory transistor from the first state to the second state, between the drain electrode and the source electrode of the memory transistor.

To achieve the objects, a method of driving the memory circuit according to the present invention is a method of driving the memory circuit according to any one of the seventh to tenth aspects of the present invention.

According to a third aspect, the method includes:

a step of turning on the memory transistor by applying a predetermined voltage to the gate electrode of the memory transistor that forms the memory element in the first state;

a step of applying a voltage, which is necessary for writing to change the memory transistor from the first state to the second state, between the drain electrode and the source electrode of the memory transistor forming the memory element; and a step of turning on the memory transistor forming the selection transistor by applying a predetermined voltage to the gate electrode.

According to a fourth aspect, in the method of driving the memory circuit according to the third aspect of the present invention, at the time when the voltage necessary for the writing is applied to the memory transistor forming the memory element, the voltage applied to the gate electrode of the memory transistor forming the selection transistor relative to the voltage of the source electrode is higher than the voltage applied to the gate electrode of the memory transistor forming the memory element relative to the voltage of the source electrode.

According to a fifth aspect, in the method of driving the memory circuit according to the fourth aspect of the present invention, the drain electrode of the memory transistor forming the memory element and serving as one end of the series circuit is connected to a higher voltage side than the source electrode of the memory transistor forming the selection transistor and serving as the other end of the series circuit, and the voltage applied to the gate electrode of the memory transistor forming the selection transistor is the same as the voltage applied to the gate electrode of the memory transistor forming the memory element.

According to a sixth aspect, in the method of driving the memory circuit according to any one of the first to fifth aspects of the present invention, the voltage applied to the gate electrode and the voltage applied to the drain electrode are the same.

According to a seventh aspect, in the method of driving the memory circuit according to any one of the first to sixth aspects of the present invention, the application of the voltage to the gate electrode and the application of the voltage to the drain electrode are simultaneously performed.

According to an eighth aspect, in the method of driving the memory circuit according to any one of the first to seventh aspects of the present invention, the voltage necessary for the writing is applied with a substrate temperature being increased.

In the method of driving the memory circuit according to any one of the first to eighth aspects of the present invention, voltages necessary for writing are applied to the gate electrode and the drain electrode of the memory element according to the present invention, and a writing current with a current density not less than a predetermined value is flown. With this process, the state of the memory element can be changed from the first state to the second state.

It does not matter which one of the step of applying the voltage to the gate electrode of the memory element and the step of applying the voltage to the drain electrode of the memory element is performed first. When the application of the voltage to the gate electrode and the application of the writing voltage to the drain electrode are simultaneously carried out, high-speed writing becomes possible.

When the voltage applied to the gate electrode and the voltage applied to the drain electrode are set to be the same, from the above-mentioned Equation 1, the quantity of heat Pw generated in the channel region per unit time is optimized, whereby the writing can efficiently be performed.

When the writing voltage is applied with the substrate temperature being preliminarily increased, power necessary for increasing the temperature of the metal oxide semiconductor in the channel region can be reduced, whereby the speed for reaching the temperature necessary for the writing, e.g., the writing speed is increased. In addition, the writing can be performed with the lower writing voltage.

In particular, according to the method of driving the memory circuit according to any one of the second to fifth aspects of the present invention, the writing for changing the memory state of the memory transistor from the first state to the second state can be performed to the memory circuit formed by connecting in series the transistor for selecting a cell to the memory transistor according to the present invention.

The selection transistor can be configured by the memory transistor according to the present invention. In other words, two memory transistors according to the present invention are connected in series, wherein one of two memory transistors is used as a memory element storing information and the other one is fixed to the first state to be used as a transistor for selecting a cell. In this case, the memory transistor used as the selection transistor can be formed by the same process as the memory transistor used as the memory element. Therefore, a separate process for forming the selection transistor is not needed, whereby the manufacturing process becomes simple and easy.

Notably, since the memory transistor used as the selection transistor is connected in series to the memory transistor used to store information, it is necessary to prevent the selection transistor from being written by the current flowing during the writing of the memory transistor forming the memory element. In view of this, upon setting the gate voltage applied to each memory transistor during the writing, it is preferable that the voltage Vgs applied between the gate and the source of the memory element in the selection transistor is set to be higher than the voltage applied between the gate and the source of the memory element.

With this configuration, the on resistance of the selection transistor becomes smaller than the on resistance of the memory element, whereby the voltage distributed between the source and the drain of the selection transistor becomes lower than the voltage distributed between the source and the drain of the memory element. Consequently, the heat generation in the channel region of the selection transistor can be suppressed compared to that of the memory element, whereby the unintentional writing to the selection transistor can be prevented.

When the source electrode of the memory transistor forming the memory element is connected in series to the drain electrode of the selection transistor to form the memory cell, the source electrode of the selection transistor is preferably connected to the low-voltage side (e.g., grounded). Even if the same voltage is applied to the gate electrodes of both memory transistors, the voltage Vgs applied between the gate and the source of the memory transistor forming the selection transistor is higher than the voltage Vgs applied between the gate and the source of the memory transistor forming the memory element by the voltage Vds, which is distributed to the selection transistor, between the source and the drain.

To achieve the objects, a method of driving the memory circuit according to the present invention is a method of driving the memory circuit according to any one of the first to tenth aspects of the present invention.

According to a ninth aspect, the method includes:

a step of applying, to the gate electrode of the memory transistor, a predetermined voltage by which the memory transistor is turned off if the memory transistor is in the first state;

a step of applying a voltage necessary for reading between the source electrode and the drain electrode of the memory transistor; and a step of determining whether the memory transistor is in the first state or in the second state by detecting an amount of current flowing between the source electrode and the drain electrode of the memory transistor.

According to the method of driving the memory circuit according to the ninth aspect of the present invention, the reading current flowing between the source and the drain is detected with the voltage, by which the memory transistor is turned off if the memory transistor is in the first state, being applied to the gate electrode of the memory transistor subject to be read. If the memory transistor is in the first state, the reading current does not flow (or is very small), but if the memory transistor is in the second state, the memory transistor exhibits the ohmic conduction characteristic, so that the current depending upon its resistance value flows. Thus, it can be easily determined whether the memory transistor is in the first state or in the second state.

To achieve the objects, a method of driving the memory circuit according to the present invention is a method of driving the memory circuit according to any one of the sixth to tenth aspects.

According to a tenth aspect, the method includes:

a step of turning on the selection transistor by applying a predetermined voltage to a gate electrode of the selection transistor;

a step of applying, to the gate electrode of the memory transistor forming the memory element, a predetermined voltage by which the memory transistor is turned off when the memory transistor is in the first state;

a step of applying a predetermined reading voltage between both ends of the series circuit; and a step of detecting a voltage of a connection node of the memory transistor forming the memory element and the selection transistor in the series circuit.

According to the method of driving the memory circuit according to the tenth aspect of the present invention, the reading voltage is applied to the series circuit including the memory element and the selection transistor with the voltage, by which the memory transistor is turned off if the memory transistor is in the first state, being applied to the gate electrode of the memory transistor (memory element) subject to be read, and the voltage distributed to the memory element or the selection transistor out of the reading voltage is detected. Thus, it can be easily determined whether the memory transistor is in the first state or in the second state.

To achieve the objects, according to a first aspect, a non-volatile storage device according to the present invention includes:

a memory cell array including the memory circuit according to any one of the sixth to tenth aspects of the present invention in plural as a memory cell arranged in a matrix;

a first word line that extends in a row direction and connects the gate electrodes of the memory transistors forming the memory elements in the memory cells arranged in the same row;

a second word line that extends in a row direction and connects the gate electrodes of the selection transistors of the memory cells arranged in the same row;

a bit line that extends in a column direction and connects one ends of the series circuits in the memory cells arranged in the same column;

a source line that connects the other ends of the series circuits in the memory cells arranged in the same column or in the same row;

a first word-line voltage application circuit that applies a voltage to the first word line;

a second word-line voltage application circuit that applies a voltage to the second word line;

a bit-line voltage application circuit that applies a reading voltage or a writing voltage to the bit line connected to the memory cell selected as a subject to be read or to be written; and a determination circuit that determines whether the memory cell selected as the subject to be read is in the first state or in the second state.

The non-volatile storage device according to the first aspect uses the memory transistor according to the present invention to store information. Accordingly, a compact and low power consumption non-volatile storage device can be realized.

According to a second aspect, in the non-volatile storage device according to the first aspect of the present invention, during the reading of the selected memory cell, the determination circuit determines whether the selected memory cell is in the first state or in the second state by applying, to the first word line connected to the selected memory cell, a predetermined voltage by which the memory transistor is turned off if the memory transistor forming the memory element is in the first state, by applying, to the second word line connected to the selected memory cell, a predetermined voltage by which the selection transistor is turned on, and by detecting a reading current flowing through the selected memory cell with the reading voltage being applied to the bit line connected to the selected memory cell.

In the non-volatile storage device according to the second aspect of the present invention, the determination circuit detects the reading current flowing between the source and the drain with the voltage, by which the transistor structure becomes an off state if the memory transistor is in the first state, being applied to the gate electrode of the memory transistor during the reading. Thus, it can be easily determined whether the memory element is in the first state or in the second state.

According to a third aspect, in the non-volatile storage device of the present invention according to the first aspect, the determination circuit includes a resistance inserted between the bit line connected to the memory cell selected as the subject to be read and the bit-line voltage application circuit, and during the reading of the selected memory cell, the determination circuit determines whether the selected memory cell is in the first state or in the second state by applying, to the first word line connected to the selected memory cell, a predetermined voltage by which the memory transistor is turned off if the memory transistor forming the memory element is in the first state, by applying, to the second word line connected to the selected memory cell, a predetermined voltage by which the selection transistor is turned on, and by detecting a voltage on a connection node of the resistance and the selected memory cell with the reading voltage being applied to the bit line connected to the selected memory cell.

In the non-volatile storage device according to the third aspect of the present invention, the determination circuit forms the series circuit including the memory element and the resistance with the voltage, by which the transistor structure becomes an off state if the memory element is in the first state, being applied to the gate electrode of the memory element, and the voltage distributed to the resistance is detected by the application of the reading current, during the reading. Thus, it can be easily determined whether the memory element is in the first state or in the second state can easily be determined.

It is preferable that, in the non-volatile storage device according to any one of the first to third aspects of the present invention, the source line is connected to the reference potential.

In order to achieve the foregoing objects, the liquid crystal display device according to the present invention includes the non-volatile storage device according to any one of the first to third aspects of the present invention.

Effects of the Invention

As described above, the present invention can realize a memory circuit including a memory element (memory transistor) that can perform writing with a small current and a low voltage, i.e., with low power consumption, and a method of driving the memory circuit, and can realize a non-volatile storage device that can easily reduce a chip size. The present invention can also realize a liquid crystal display device utilizing the non-volatile storage device according to the present invention.

The present invention can also realize a logic circuit that can change a combination of an output logical value and an input logical value depending upon the memory state of the memory element by utilizing the characteristic of the memory transistor.

BRIEF DESCRIPTION OF THE DRAWINGS

FIG. 19 is a table illustrating a relationship between an input voltage and an output voltage in the logic circuit formed by using the memory element according to the present invention.

FIG. 21 is a table illustrating a relationship between an input voltage and an output voltage in the logic circuit formed by using the memory element according to the present invention.

FIG. 24 is a table illustrating a relationship between an input voltage and an output voltage in the logic circuit formed by using the memory element according to the present invention.

MODE FOR CARRYING OUT THE INVENTION

Figure 1:
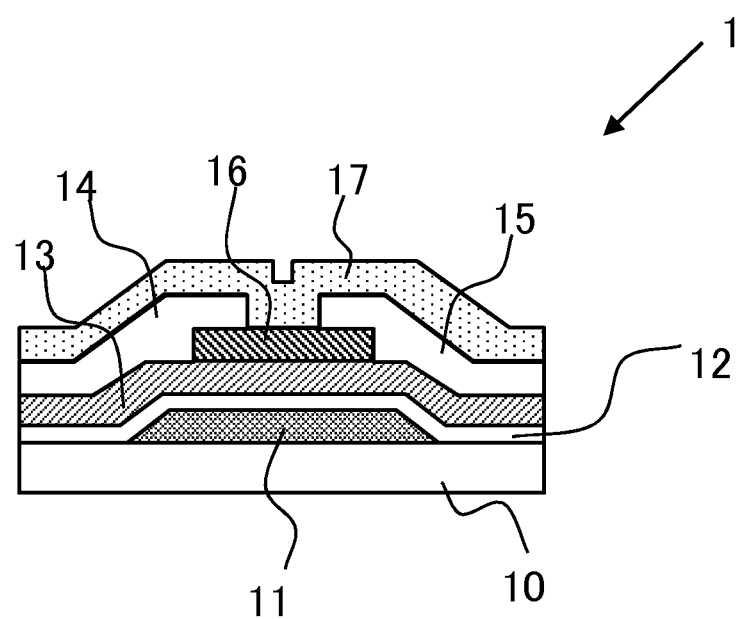
FIG. 1 is a sectional view illustrating a structure of a memory element according to one embodiment of the present invention.

Embodiments of the present invention will be described below in detail with reference to the drawings. In the drawings below, for convenience of explanation, essential parts are emphasized, and a dimension ratio of each component in an element do not always match the actual dimension ratio.

First Embodiment

Figure 2:
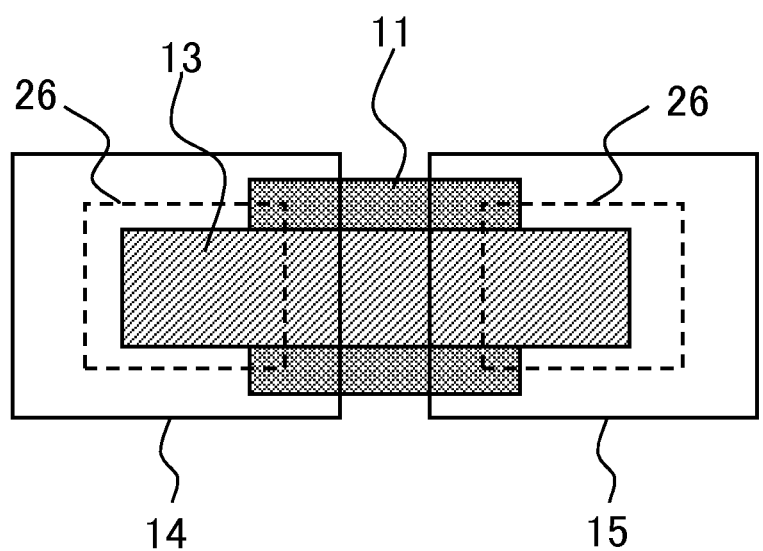
FIG. 2 is a view illustrating one example of a layout on a top surface of the memory element according to one embodiment of the present invention.

FIG. 1 is a sectional view schematically illustrating a structure of a memory element (memory transistor) 1 according to one embodiment of the present invention. FIG. 2 illustrates a layout example on a top surface of the memory element 1. In the present embodiment, the memory element 1 has a transistor structure same as a thin-film transistor (TFT) of a bottom gate structure formed on an insulating substrate such as a glass.

((1. Memory Element))

As illustrated in FIG. 1, the memory element 1 includes, on a glass substrate 10, a gate electrode 11, a gate insulating film 12 covering the gate electrode 11, a metal oxide semiconductor layer 13, a source electrode 14, a drain electrode 15, and a channel etch stopper layer 16. The memory element 1 also includes a passivation layer 17 formed on these components.

The metal oxide semiconductor layer 13 formed on the gate insulating film 12 is formed by including IGZO (InGaZnOx) that is one type of amorphous oxide semiconductor in the present embodiment. IGZO is N-type metal oxide semiconductor including indium (In), gallium (Ga), zinc (Zn), and oxygen (O) as a main component, and has a feature that it can be formed as a film at low temperature. Notably, IGZO is sometimes called IZGO or GIZO. Although the composition ratio of each metal element In:Ga:Zn in the metal oxide semiconductor layer 13 is approximately 1:1:1, the effect of the present invention is obtained even by adjusting the composition ratio based upon this composition ratio. Examples of usable materials for the metal oxide semiconductor layer 13 in addition to IGZO include oxide semiconductor such as NiO, $SnO_2$, $TiO_2$, $VO_2$, $In_2O_3$, and $SrTiO_3$, and oxide semiconductor formed by adding various impurities to these materials.

The gate electrode 11, the source electrode 14, and the drain electrode 15 each are made of a material having conductivity. The source electrode 14 and the drain electrode 15 are formed to be in contact with the metal oxide semiconductor layer 13, and to cover a part of the channel etch stopper layer 16. The channel etch stopper layer 16 is a stopper film that prevents the metal oxide semiconductor layer 13 in the channel region from being etched during the formation of the source electrode 14 and the drain electrode 15 by etching. In the present embodiment, the channel etch stopper layer 16 has a function as an oxygen absorption layer that absorbs oxygen, which is diffused due to writing of the memory element 1, in the metal oxide semiconductor layer 13, and fixes the absorbed oxygen in order not to return again to the metal oxide semiconductor layer 13.

Accordingly, the channel etch stopper layer 16 may be made of a material used in a conventional metal oxide semiconductor TFT process, but it is desirably made of a material having high oxygen absorption ratio in order to fix oxygen desorbed from the metal oxide semiconductor layer 13 during writing. For example, an Si-rich CVD oxide silicon film is preferable. Examples of another materials that can be used for the channel etch stopper layer 16, which can also be used as the oxygen absorption layer, include silicon nitride, silicon oxynitride, $Al_2O_3$, MnO, SiOF, SiOC, organic polymer, and silica insulating film.

One example of a method of manufacturing the memory element 1 will be described below.

Firstly, the gate electrode 11 is formed on the glass substrate 10. Specifically, a film formation using a sputtering method with titanium being used as a target material and a film formation using a sputtering method with aluminum being used as a target material are alternately carried out at a temperature of 100° C., whereby a stacked film including a titanium layer with a thickness of 50 nm, an aluminum layer with a thickness of 200 nm, and a titanium layer with a thickness of 100 nm is successively formed. Thereafter, the stacked film on a region except for a region where the gate electrode is to be formed is removed by dry etching using chlorine gas and argon gas.

Next, the gate insulating film 12 is formed to cover the gate electrode. In the present embodiment, the film is formed with a CVD method by supplying silane ($SiH_4$) gas and dinitrogen monoxide ($N_2O$) gas at a temperature of 300° C., whereby an oxide silicon film with a thickness of 300 nm is formed on all over the surface.

Next, the metal oxide semiconductor layer 13 is formed. Specifically, in the present embodiment, oxygen and argon gas are supplied to a sputtering device, and an IGZO layer with a thickness of 20 nm to 150 nm is formed by using an IGZO target (composition ratio In:Ga:Zn:O=1:1:1:4). An IGZO target having a composition ratio other than the above-mentioned ratio may be used as a target. Thereafter, wet etching using mixed etchant containing phosphoric acid, nitric acid, and acetic acid is carried out to remove the IGZO layer on a region except for a region where the metal oxide semiconductor layer 13 is to be formed.

Next, an oxide silicon film with a thickness of 100 nm to 400 nm is formed by a CVD method as the channel etch stopper layer 16, and then the silicon film 16 in a region 26 in FIG. 2 is removed to form a contact opening.

Next, the source electrode 14 and the drain electrode 15 are formed. Specifically, as in the formation of the gate electrode 11, a film formation using a sputtering method with titanium being used as a target material and a film formation using a sputtering method with aluminum being used as a target material are alternately carried out at a temperature of 100° C., whereby a stacked film including a titanium layer with a thickness of 50 nm, an aluminum layer with a thickness of 200 nm, and a titanium layer with a thickness of 100 nm is successively formed. Thereafter, the stacked film on a region except for a region where the source electrode and the gate electrode are to be formed is removed by dry etching using chlorine gas and argon gas.

Next, the passivation layer 17 is formed. In the present embodiment, the film is formed with a CVD method by supplying silane ($SiH_4$) gas and dinitrogen monoxide ($N_2O$) gas at a temperature of 200° C., whereby an oxide silicon film with a thickness of 150 nm is formed on all over the surface to cover the region where the memory element is formed. Thereafter, the resultant is baked in an atmosphere at a temperature of 300° C., whereby the memory element 1 is manufactured.

When the gate insulating film 12 or the passivation layer 17 is etched during the manufacturing process described above, dry etching using tetrafluoromethane ($CF_4$) and oxygen may be carried out. The film-forming condition for each film during the manufacturing process described above is only illustrative, and it is obvious that each film may be formed under a film-forming condition other than the above-mentioned film-forming condition.

The memory element 1 shows a first state of being capable of performing a transistor operation corresponding to a state of the applied voltage to the source electrode 14, the drain electrode 15, and the gate electrode 11 in an initial state after the manufacture. On the other hand, the memory element 1 is changed to a second state, in which the memory element 1 exhibits ohmic conduction characteristics as a conductor and loses a current control property as a transistor, due to Joule heat generated in the channel region by a current with a current density of not less than a predetermined value flowing between the source electrode 14 and the drain electrode 15. The memory element 1 can be used as a memory circuit that stores information in a non-volatile manner by determining whether the memory element 1 is in the first state or in the second state.

When the memory element 1 is assembled in a memory cell, writing can be performed with low power consumption, whereby a non-volatile storage device that can easily reduce a chip size can be realized.

Subsequently, methods of driving the memory circuit including the memory element 1 will be described.

((2. Writing Method))

Figure 3:
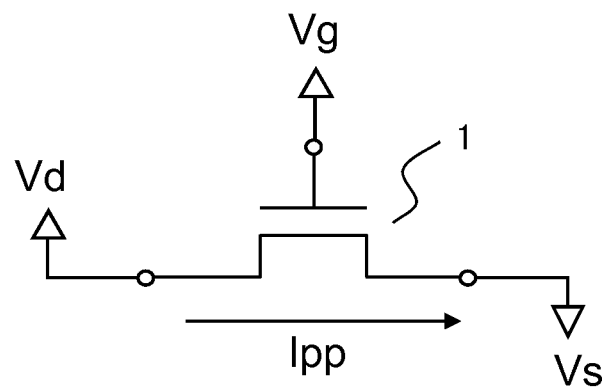
FIG. 3 is a diagram illustrating one example of a voltage application method when writing of the memory element according to the present invention is performed.
Figure 3:
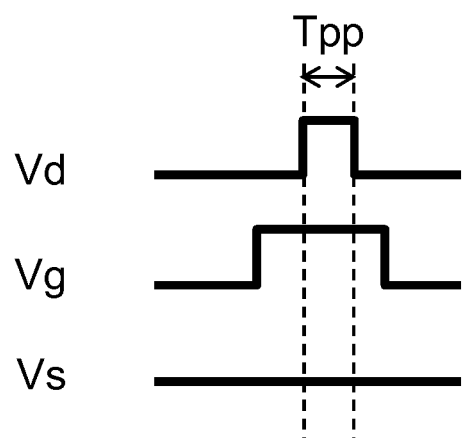

FIG. 3 illustrates one example of a voltage waveform of a voltage applied to the gate electrode 11, the source electrode 14, and the drain electrode 15, when writing for changing the memory element 1 from the first state to the second state is performed.

Firstly, a gate voltage Vg is increased to a voltage necessary for writing to turn on the transistor structure of the memory element 1. Then, a drain voltage Vd is increased to a voltage necessary for the writing. In this case, a fixed voltage Vs is applied to the source electrode 14 during the writing.

Thereafter, the drain voltage Vd is decreased to the voltage before the writing, and then the gate voltage Vg is decreased to the voltage before the writing.

Thus, a writing current Ipp keeps flowing between the source and the drain during a period Tpp in which both the gate voltage Vg and the drain voltage Vd become the voltage necessary for the writing. Specifically, the metal oxide semiconductor layer 13 in the channel region is heated by Joule heat during this period, whereby the composition change of the metal oxide semiconductor layer 13 is induced. As a result, the memory element 1 is changed from the first state to the second state.

In the above example, the gate voltage Vg is increased to the voltage necessary for the writing, and then the drain voltage Vd is increased to the voltage necessary for the writing, whereby the writing current Ipp flows during the period Tpp. On the contrary, the voltage waveforms of the drain voltage Vd and the gate voltage Vg in FIG. 3 may be reversed, the drain voltage Vd may be increased to the voltage necessary for the writing, and then the gate voltage Vg may be increased to the voltage necessary for the writing. In addition, the period from the application of the gate voltage Vg till the application of the drain voltage Vd is shortened as much as possible, which can realize the writing with higher speed.

Figure 4:
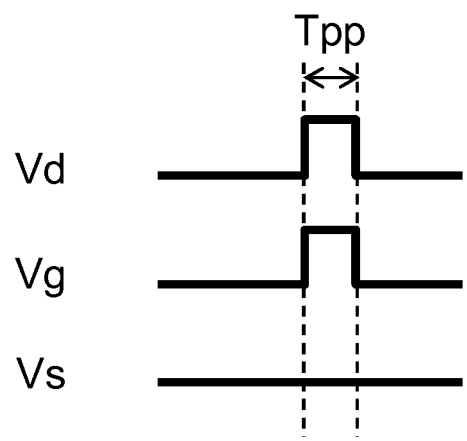
FIG. 4 is a diagram illustrating another example of a voltage application method when writing of the memory element according to the present invention is performed.

Accordingly, as illustrated in FIG. 4, the desirable voltage application method is such that the application of the gate voltage Vg and the application of the drain voltage Vd are simultaneously performed, and the application of the gate voltage Vg and the application of the drain voltage Vd are simultaneously stopped.

Here, the Joule heat Pw per unit time generated in the channel region of the memory element 1 is represented by Pw=Vds·Ipp as stated above, wherein the voltage between the source and the drain is defined as Vds (=Vd−Vs). On the other hand, the writing current Ipp is represented by the above-mentioned Equation 1, and depends upon the voltage Vgs (=Vg−Vs) between the gate and the source in a saturation region. Therefore, when a certain writing voltage Vpp is given, the amount of generated heat becomes maximum by setting both the drain voltage Vd and the gate voltage Vg to Vpp, resulting in that the writing can be performed more efficiently.

Figure 5:
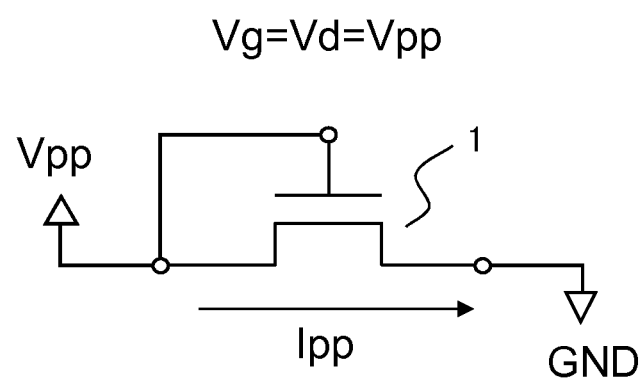
FIG. 5 is a diagram illustrating another example of a voltage application method when writing of the memory element according to the present invention is performed.

Accordingly, as illustrated in FIG. 5, a more preferable voltage application method is such that the source voltage is connected to a fixed voltage (e.g., a ground potential GND), and the writing voltage Vpp is applied from the drain side, with the gate electrode 11 and the drain electrode 15 being short-circuited.

The writing current Ipp is set such that the temperature in the channel region of the transistor structure rises to a temperature range (e.g., 200° C. to 900° C.) sufficient for changing the chemical composition ratio of the metal oxide semiconductor layer 13 by electromigration, the channel region being not fused and the channel region being not broken by the electromigration of the element forming the metal oxide semiconductor layer 13 within this temperature range. Specifically, the writing current Ipp is set in order that the current density per channel width falls within a range of 20 to 1000 μA/μm depending upon the density of the current flowing through the channel region of the transistor structure. The writing voltage Vpp is set to obtain the above current density. The applying time Tpp of the writing voltage Vpp is set to satisfy the above condition within the range of 10 μs to 500 ms.

When the writing voltage Vpp is applied with the substrate temperature being preliminarily increased, power necessary for the temperature rise can be reduced, and the time required for rising the temperature to the temperature necessary for the writing is shortened, whereby the writing can be performed with higher speed. In addition, the writing can be performed with the lower writing voltage.

((3. Reading Method))

Figure 6:
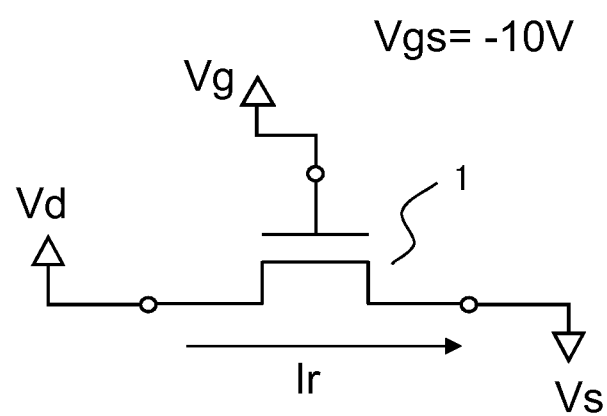
FIG. 6 is a diagram illustrating one example of a voltage application method when reading of the memory element according to the present invention is performed.

FIG. 6 illustrates one example of a method of applying a voltage to the gate electrode 11, the source electrode 14, and the drain electrode 15, when the state of the memory element 1 is read. In the example in FIG. 6, a voltage (hereinafter referred to as "off voltage" according to need) that brings the transistor into an off state if the memory element 1 is in the first state, is applied to the gate electrode 11 of the memory element 1, a voltage necessary for the reading is applied to the drain electrode 15, with a fixed voltage (here, GND) being applied to the source electrode 14, and an amount of current flowing between the source and the drain is detected.

When the memory element 1 is in the first state, the transistor is in the off state, so that a current does not flow. However, when the memory element 1 is in the second state, the memory element 1 exhibits ohmic conduction characteristics, so that a current depending upon its resistance value flows. Therefore, the amount of the current flowing between the source and the drain can be detected, whereby whether the memory element 1 is in the first state or in the second state can easily be determined.

Figure 7:
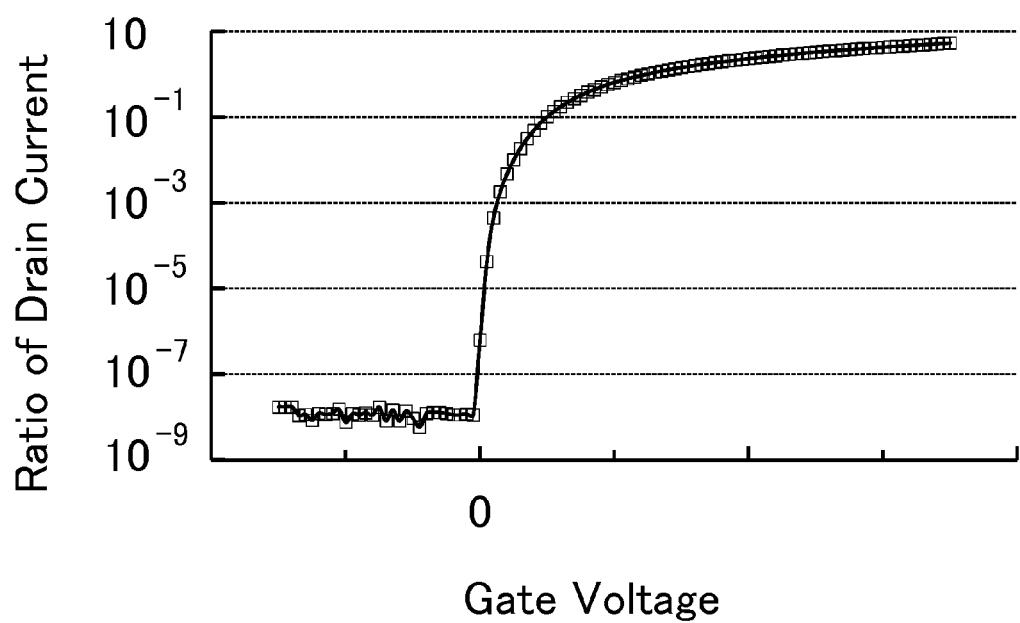
FIG. 7 is a graph illustrating a ratio of a change in current between a source and a drain of the memory element of the present invention before and after the writing, as a dependence on the gate voltage.
Figure 8:
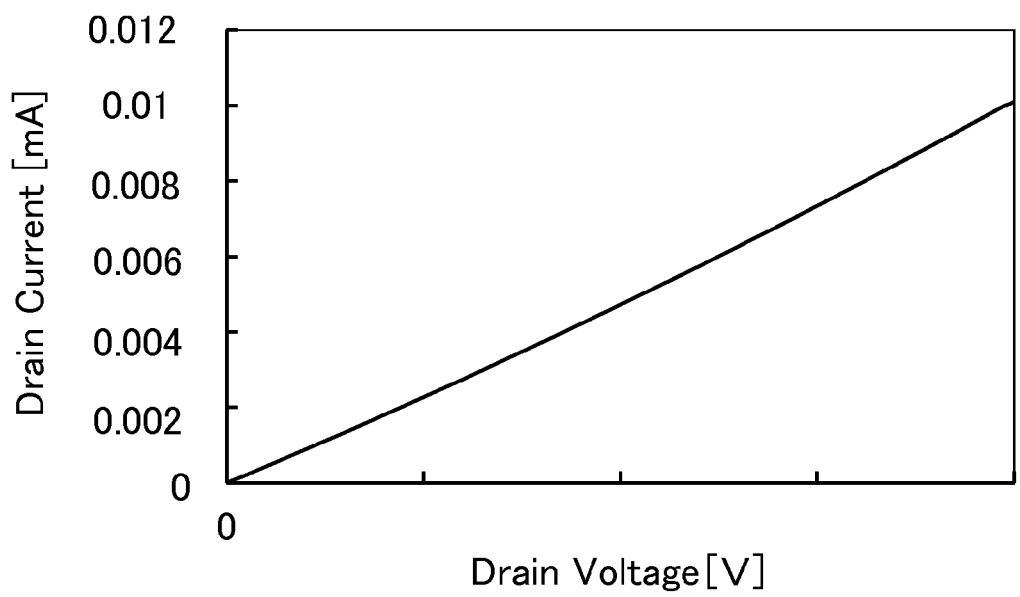
FIG. 8 is a graph illustrating a dependence of the current between the source and the drain on the voltage applied between the source and the drain after the writing according to the present invention.

FIG. 7 illustrates a dependence of the reading current on the gate voltage flowing when the voltage necessary for the reading is applied between the source and the drain of the memory element 1, as a ratio of the reading current flowing in the first state to the reading current flowing in the second state. As stated above, when the memory element 1 is in the second state, the flowing reading current is almost constant regardless of the voltage application state of the gate electrode, and the change in the current ratio in FIG. 7 reflects the dependence of the reading current in the first state on the gate voltage.

In FIG. 7, the memory element 1 that is in the first state becomes the off state when a negative voltage is applied to the gate voltage Vg. It is found that, in this case, the reading current ratio of about $10^8$ is obtained between the first state and the second state. Therefore, it can be easily determined whether the memory element 1 is in the first state or in the second state.

By driving the memory element 1 as described above, the memory element 1 can be used as a memory circuit that stores information in a non-volatile manner, wherein the first state is assigned to a logical value "0", and the second state is assigned to a logical value "1", for example.

((4. Memory Circuit))

Figure 9:
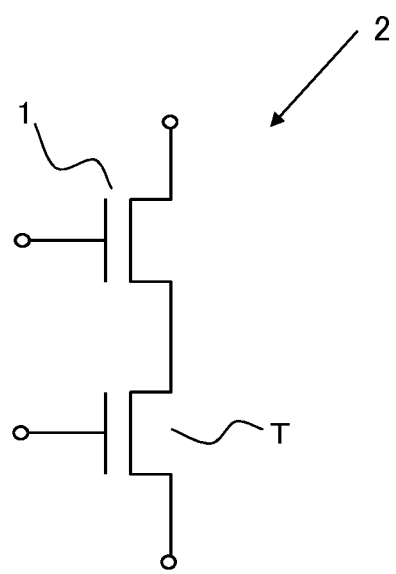
FIG. 9 is a circuit diagram illustrating an example of a structure of a memory circuit according to one embodiment of the present invention.

FIG. 9 illustrates an example of a configuration of a memory circuit (memory cell) including the memory element 1 described above. A memory cell 2 illustrated in the circuit diagram in FIG. 9 is formed by connecting a selection transistor T for selecting a memory cell to the memory element 1 in series.

In the memory cell 2, the above-mentioned off voltage is applied to the gate electrode 11 of the memory element 1, and the selection transistor T is brought into the on state before the voltage necessary for the writing or the reading is applied, or the off voltage is applied to the gate electrode 11 of the memory element 1, and the selection transistor T is brought into the on state with the voltage necessary for the writing or the reading being applied, in the above-mentioned driving method of the memory element 1. With this operation, the writing action or the reading action of the selected memory cell can be executed.

Any structure can be employed for the selection transistor T, so long as it can control a current flowing through the memory element 1. When the transistor structure same as the memory element 1 is employed, the memory element 1 and the selection transistor T can be formed by the same manufacturing process, whereby the process cost can be reduced. In this case, the memory state of the selection transistor T as the memory element is fixed to the first state. It is also necessary to prevent the selection transistor T from being written by the writing of the memory element 1.

The memory element 1 and the selection transistor T are connected in series. Therefore, when the writing current Ipp flows through the memory element 1, the same current flows through the selection transistor T. In order to prevent the selection transistor T from being written to the second state by the Joule heat generated by this current, the voltage applied between the source and the drain of the selection transistor T is set to be smaller than the voltage applied between the source and the drain of the memory element 1 when the writing voltage is applied on both ends of the memory cell.

For this, design parameters, such as the channel length, the channel width, and the threshold voltage, of the transistor structure of each of the memory element 1 and the selection transistor T are adjusted to set the on resistance value in the on state in the first state to be smaller in the selection transistor T. Alternatively, the voltage application condition during the writing is adjusted to set the voltage applied between the gate and the source to be higher in the selection transistor T.

Figure 10A:
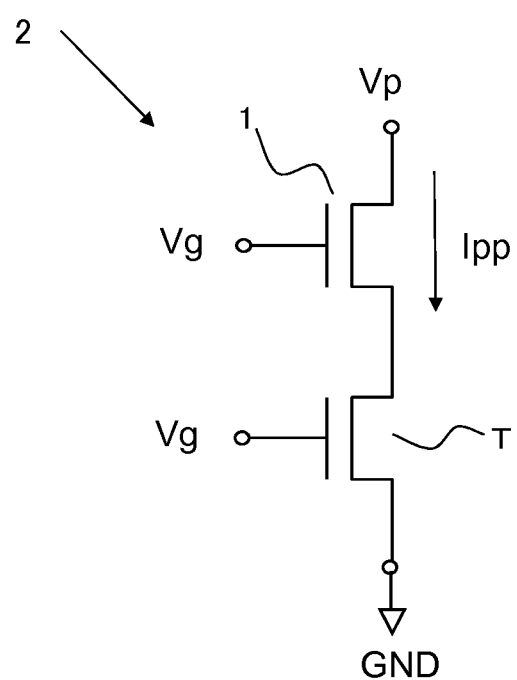
FIGS. 10A and 10B each are a diagram illustrating one example of a voltage application method during writing of the memory circuit according to one embodiment of the present invention.
Figure 10B:
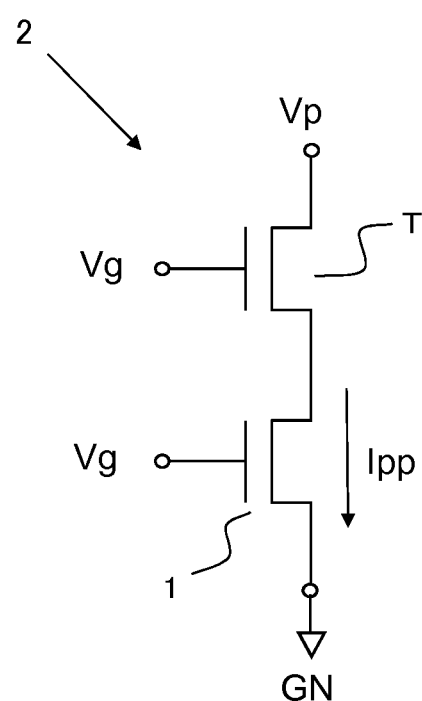

FIG. 10 illustrate examples of a voltage application method of the memory cell 2 during writing. In FIG. 10, when the voltage applied to the gate electrode of each of the memory element 1 and the selection transistor T is set to the same Vg, the voltage applied between the gate and the source of the transistor connected to the high-voltage side reduces by the voltage applied between the source and the drain of the transistor connected to the low-voltage side. Therefore, the method illustrated in FIG. 10A in which the source electrode of the selection transistor T is grounded in order that the selection transistor T is on the low-voltage side and the writing voltage Vpp is applied to the drain electrode of the memory element 1 is more preferable than the method illustrated in FIG. 10B in which the source electrode of the memory element 1 is grounded in order that the selection transistor T is on the high-voltage side and the writing voltage Vpp is applied to the drain electrode of the selection transistor T.

Second Embodiment

Figure 11A:
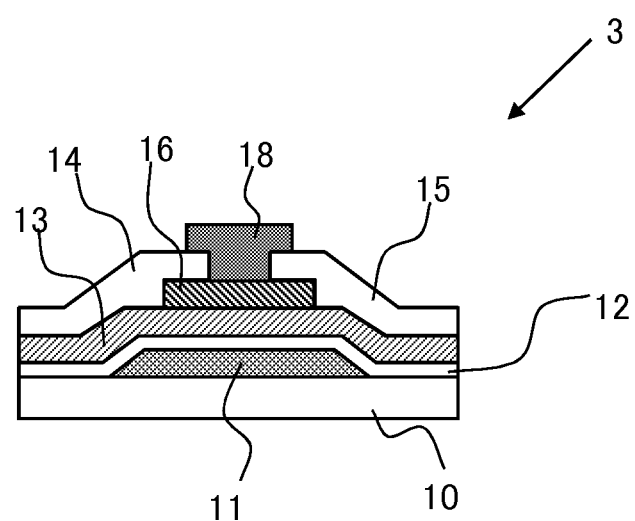
FIGS. 11A and 11B are a sectional view illustrating a structure of a memory element according to one embodiment of the present invention, and an example of a layout on a top surface of the memory element, respectively.
Figure 11B:
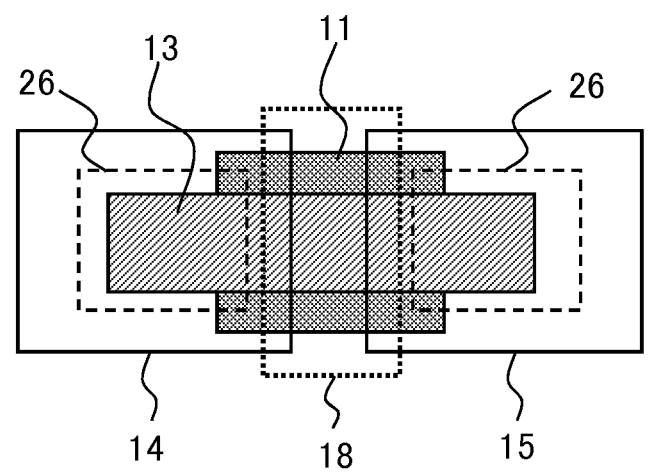

FIG. 11 illustrates another configuration of the memory element according to the present invention. FIG. 11A is a sectional view schematically illustrating a structure of a memory element (memory transistor) 3 according to one embodiment of the present invention. FIG. 11B illustrates an example of a layout on a top surface of the memory element 3. The memory element 3 includes an insulating material layer 18 having higher oxygen absorption ratio on the channel region of the above-mentioned memory element 1 via the channel etch stopper layer 16. In the present embodiment, the insulating material layer 18 functions as an oxygen absorption layer that absorbs oxygen diffused in the metal oxide semiconductor layer 13 due to the writing of the memory element 3 and fixes the oxygen in order not to return again in the metal oxide semiconductor layer 13. The insulating material layer 18 is a Si-rich CVD oxide silicon film, for example. The channel etch stopper layer 16 may be made of a material used in the conventional metal oxide semiconductor TFT process. The passivation layer 17 is not illustrated in the drawing.

Here, the insulating material layer 18 is formed in a region indicated by a dotted line in FIG. 11B. It is preferable that the channel width (the width of the region where the metal oxide semiconductor 13 is formed in FIG. 11B) is set as narrower as possible in order to increase the density of the current flowing through the metal oxide semiconductor layer 13 in the channel region during the writing. It is also preferable that the gate electrode is arranged such that the width of the region of the gate electrode 11 overlapping with the metal oxide semiconductor layer 13 is decreased, i.e., the channel length becomes short, in order to effectively increase the temperature of the metal oxide semiconductor layer 13 in the channel region by Joule heat.

Figure 12A:
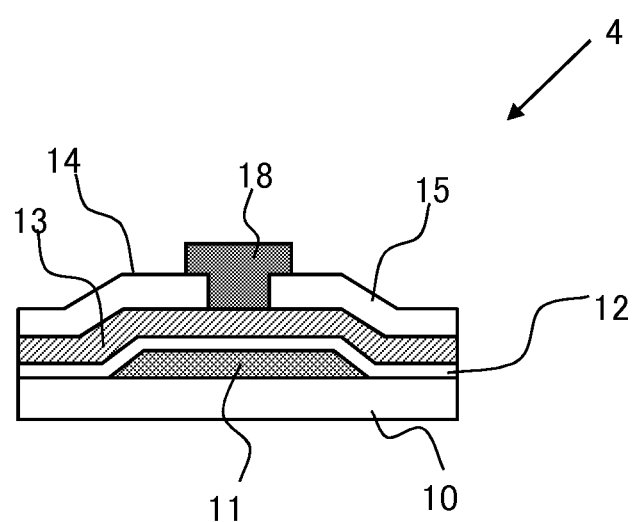
FIGS. 12A and 12B are a sectional view illustrating a structure of a memory element according to one embodiment of the present invention, and an example of a layout on a top surface of the memory element, respectively.
Figure 12B:
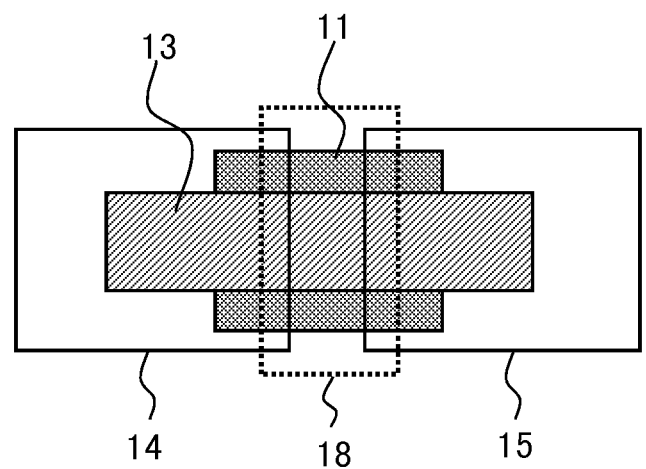

FIG. 12 illustrates another configuration of the memory element according to the present invention. FIG. 12A is a sectional view schematically illustrating a structure of a memory element (memory transistor) 4 according to one embodiment of the present invention. FIG. 12B illustrates an example of a layout on a top surface of the memory element 4. Different from the memory element 3, the memory element 4 includes the insulating material layer 18 having high oxygen absorption ratio, the insulating material layer 18 being directly formed on the metal oxide semiconductor layer 13 without forming the channel etch stopper layer 16. The passivation layer 17 is not illustrated in the drawing.

In the memory elements 3 and 4 described above, the insulating material layer 18 acts as an oxygen absorption layer that absorbs and fixes oxygen that is diffused in the metal oxide semiconductor layer 13 due to the writing of the memory element. Therefore, the transfer of oxygen into the channel region by the additional heating can be prevented, whereby the variation in the resistance value in the second state can be prevented.

Third Embodiment

Figure 13:
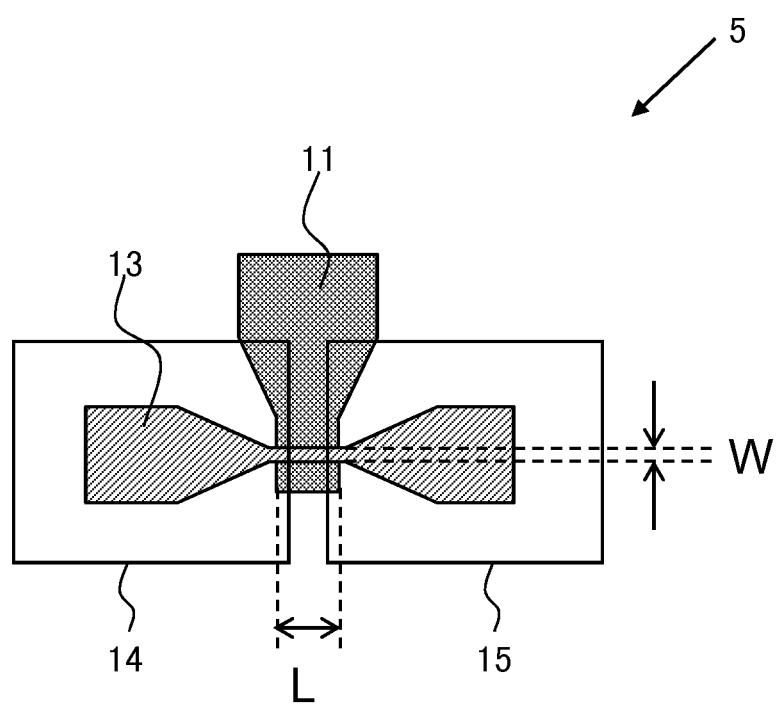
FIG. 13 is a view illustrating one example of a layout on a top surface of the memory element according to one embodiment of the present invention.

FIG. 13 illustrates an example of a layout on a top surface of a memory element (memory transistor) 5 according to one embodiment of the present invention. The memory element 5 is formed by improving the layout in the region where the gate electrode 11 and the metal oxide semiconductor layer 13 of the memory element 1 are formed in order to effectively heat the channel region with lower writing voltage. The structure of the memory element 5 is similar to that of the memory element 1 illustrated in the sectional view of FIG. 1, so that a detail description will be omitted. In FIG. 13, a contact opening (corresponding to the numeral 26 in FIG. 2) is not illustrated.

As illustrated in FIG. 13, the memory element 5 is formed such that the width W of the metal oxide semiconductor layer 13 is smaller than the width in the drain region and the source region. With this, the current density of the current flowing from the source region to the drain region becomes maximum, whereby the generated Joule heat is concentrated on a narrow portion, and the heat capacity of the channel region is reduced to make it easy to increase the temperature in the narrow portion. In addition, thermal conduction from the metal oxide semiconductor layer 13 in the channel region to the other regions (particularly, to the gate electrode 11) is suppressed.

The gate electrode 11 is formed to have the minimum line width with the narrowest width L in the channel region crossing the metal oxide semiconductor layer 13, and to extend with the width being increased toward the side apart from the metal oxide semiconductor layer 13. Thus, the heat capacity of the gate electrode is reduced. The Joule heat generated by the writing current increases the temperature of the channel region, and in addition to that, it is partly used to increase the temperature of the gate electrode. Since the heat capacity of the gate electrode is reduced, the ratio of the Joule heat used to increase the temperature of the gate electrode is reduced, whereby the temperature of the metal oxide semiconductor layer 13 in the channel region is easy to be increased.

The gate electrode 11 extends only in one direction (in the upper direction in FIG. 13) beyond the channel region, and does not extend in the other direction (in the lower direction in FIG. 13) except for the minimum required extension amount from the viewpoint of a design layout. With this configuration, thermal conduction via the gate electrode 11 can be limited to one direction, whereby heat diffusion via the gate electrode can be suppressed.

Figure 14:
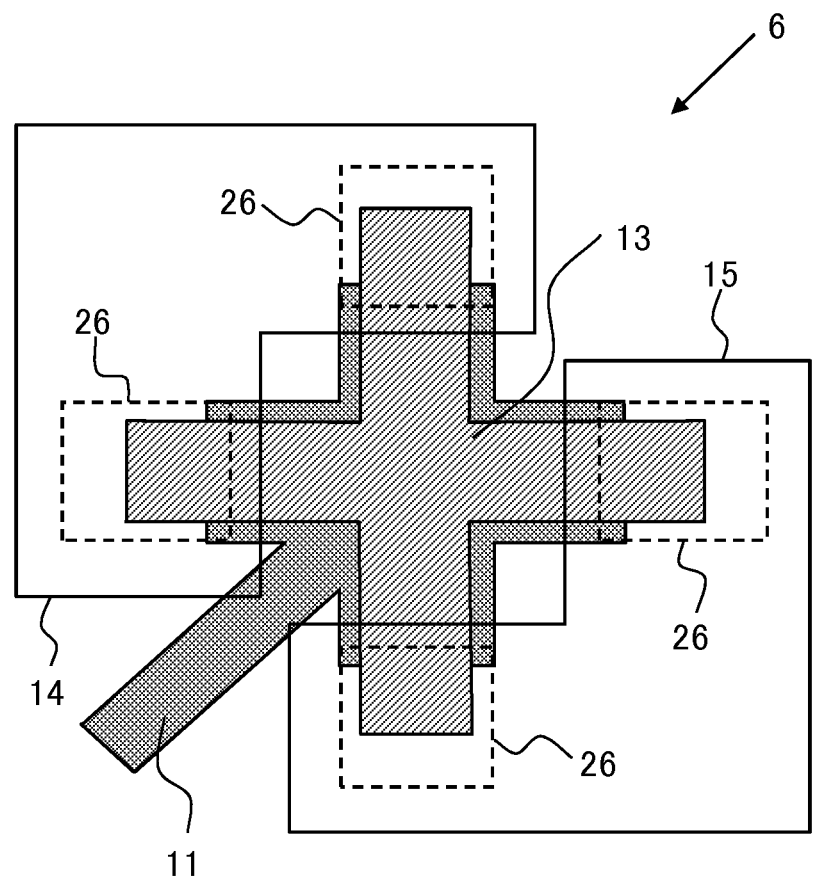
FIG. 14 is a view illustrating one example of a layout on a top surface of the memory element according to one embodiment of the present invention.

FIG. 14 illustrates one example of a layout of still another memory element. In a memory element (memory transistor) 6 illustrated in the layout of FIG. 14, the metal oxide semiconductor layer 13 is formed in a cross shape, wherein two sets of two adjacent leading ends out of four leading ends of the cross form the source region or the drain region, and the channel region is formed across the central part of the cross. In the memory element 6, the channel region becomes narrow on the central part of the cross, resulting in that the current density of the current flowing from the source region to the drain region becomes the maximum, and the generated Joule heat is concentrated on the narrow portion. Accordingly, the temperature of the narrow portion is easy to be increased.

The gate electrode 11 extends only in one direction (in the obliquely lower-left direction in FIG. 14) beyond the channel region to be connected to a wire for the element connection, and does not extend in the other direction. With this configuration, thermal conduction via the gate electrode 11 can be limited to one direction, whereby thermal conduction via the gate electrode can be suppressed.

Like the memory element 1, the memory elements 3 to 6 can form a memory circuit by connecting the selection transistor T in series, or can independently form a memory circuit, in which the first state is assigned to a logical value "0", and the second state is assigned to a logical value "1", for example. Thus, the memory elements 3 to 6 can be used to store information.

Fourth Embodiment

Figure 15:
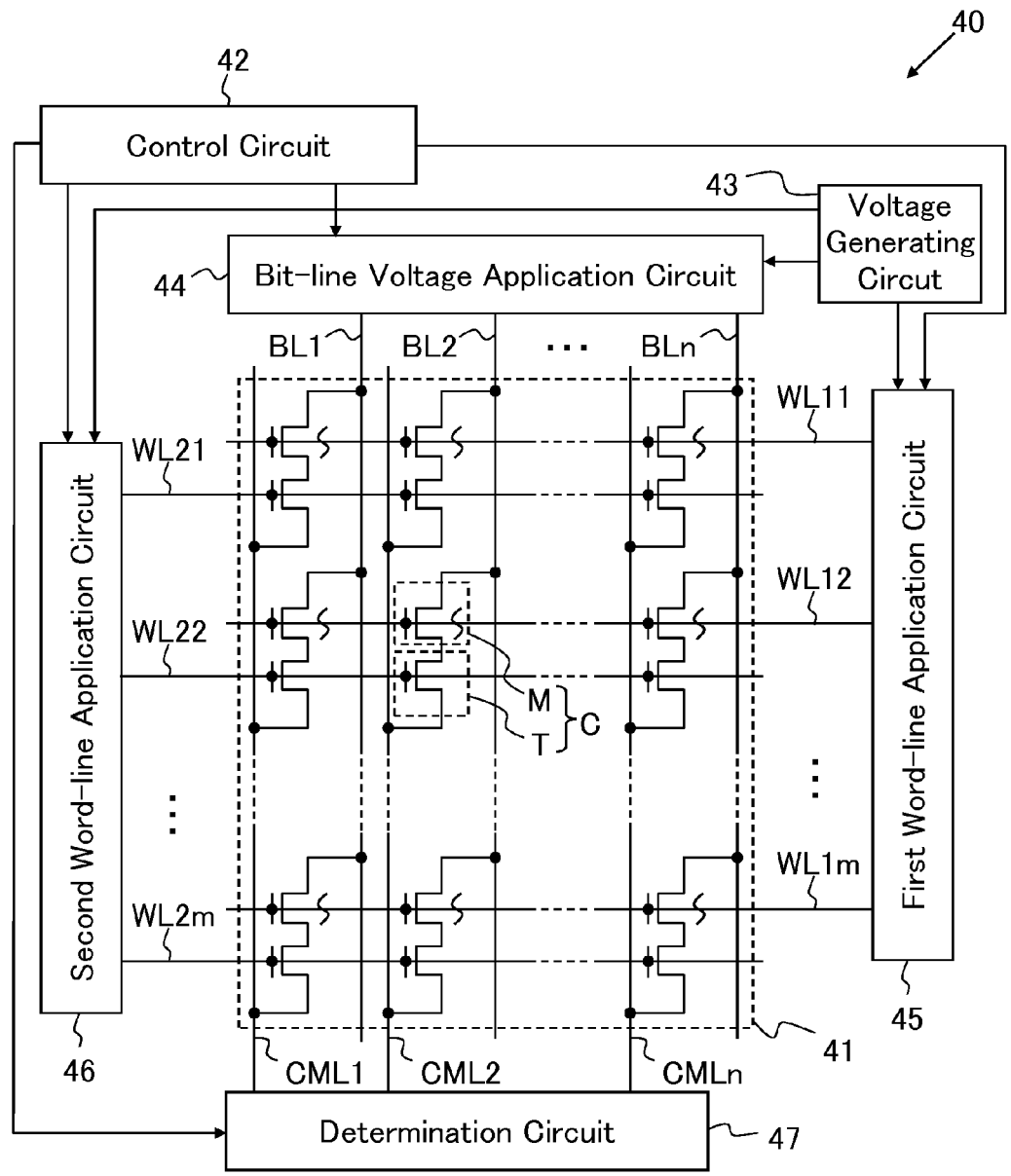
FIG. 15 is a circuit block diagram illustrating a configuration of a non-volatile storage device according to one embodiment of the present invention.

FIG. 15 illustrates an example in which a memory circuit including the above-mentioned memory element is used as a memory cell, and a plurality of memory cells are arranged in a row direction and in a column direction in a matrix to form a non-volatile storage device. FIG. 15 is a circuit block diagram illustrating a schematic configuration of a non-volatile storage device 40 according to one embodiment of the present invention. As illustrated in FIG. 15, the non-volatile storage device 40 includes a memory cell array 41, a control circuit 42, a voltage generating circuit 43, a bit-line voltage application circuit 44, a first word-line voltage application circuit 45, a second word-line voltage application circuit 46, and a determination circuit 47.

The memory cell array 41 includes a plurality of memory cells C arranged in a matrix, each of the memory cells C including a memory element M and a selection transistor T that are connected in series. The memory cells C arranged in the same column are connected to one another by bit lines BL1 to BLn (n is a natural number) extending in the column direction (in the longitudinal direction in FIG. 15), while the memory cells C arranged in the same row direction are connected to one another by first word lines WL11 to WL1m and second word lines WL21 to WL2m (m is a natural number) extending in the row direction (in the horizontal direction in FIG. 15). The memory element M may be the memory element 1 or any one of the memory elements 3 to 6. The memory cell C is formed by connecting the source electrode of the memory element M and the drain electrode of the selection transistor T. The drain electrode of the memory element M is connected to the corresponding bit line, and the source electrode of the selection transistor is connected to one of common lines CML1 to CMLn extending in the column direction for every memory cells arranged in the same column. A predetermined reference voltage (e.g., ground potential) is supplied to each common line. Therefore, the memory cell C is configured to perform writing with the voltage application method illustrated in FIG. 10A. In each memory cell C, the gate electrode of the memory element M is connected to the corresponding first word line, and the gate electrode of the selection transistor T is connected to the corresponding second word line.

The control circuit 42 controls the writing and reading actions of the memory cell array 41. Specifically, the control circuit 42 controls the bit-line voltage application circuit 44, the first word-line voltage application circuit 45, the second word-line voltage application circuit 46, and the determination circuit 47 based upon an address signal inputted from an address line (not illustrated), a data input inputted from a data line, and a control input signal inputted from a control signal line.

The voltage generating circuit 43 generates a voltage necessary for selecting the memory cell that is a subject to be operated, and a voltage applied to an unselected memory cell that is not a subject be operated. The voltage generating circuit 43 supplies these voltages to the first word-line voltage application circuit 45 and the second word-line voltage application circuit 46. The voltage generating circuit 43 generates a voltage necessary for writing and reading of the memory cell C selected to be operated, and supplies this voltage to the bit-line voltage application circuit 44.

When an address of the memory cell to be operated is designated during the writing and reading actions, the bit-line voltage application circuit 44 selects the bit line corresponding to the address, and applies the writing voltage or the reading voltage to the selected bit line. The bit-line voltage application circuit 44 applies an unselected bit-line voltage to the bit line that is not selected.

When an address of a memory cell that is a subject of the writing action is designated during the writing action, the first word-line voltage application circuit 45 selects the first word line corresponding to the address, and applies respectively a selected first word-line voltage and an unselected first word-line voltage to the selected first word line and the unselected first word line.

When an address of a memory cell to be operated is designated during the writing and reading actions, the second word-line voltage application circuit 46 selects the second word line corresponding to the address, and applies respectively a selected second word-line voltage and an unselected second word-line voltage to the selected second word line and the unselected second word line.

When the writing of the selected memory cell C is performed, the selected second word-line voltage is applied to the second word line connected to the selected memory cell, the unselected second word-line voltage is applied to the unselected second word line, the writing voltage Vpp is applied to the bit line connected to the selected memory cell with the selection transistor T of the selected memory cell C being turned on, and the selected first word-line voltage is applied to the first word line connected to the selected memory cell. As described in the first embodiment, the selected first word-line voltage is preferably equal to the writing voltage Vpp. In the present embodiment, the selected second word-line voltage is also equal to the writing voltage Vpp. The unselected second word-line voltage may be equal to the writing voltage Vpp, or may be a voltage lower than the writing voltage Vpp. Thus, Joule heat is intensively generated on the memory element M of the selected memory cell C, so that the composition change of the channel region is accelerated.

When the reading of the selected memory cell C is performed, the selected second word-line voltage is applied to the second word line connected to the selected memory cell, the unselected second word-line voltage is applied to the unselected second word line, and the reading voltage Vr is applied to the bit line connected to the selected memory cell with the selection transistor T of the selected memory cell C being turned on. In this case, the above-mentioned off voltage for bringing the memory element M in the first state into the off state is applied to all of the first word lines.

The off voltage is applied to the gate electrode of the memory element M of the selected memory cell C via the first word line. When the memory element M is written (in the second state), the memory element M exhibits conductivity even in a state in which the off voltage is applied to the gate electrode, so that the reading current flows from the bit line toward the common line. On the other hand, when the memory element M is not written (in the first state), the memory element M operates as a normal transistor. Therefore, the reading current does not flow in the state in which the off voltage is applied to the gate electrode.

The determination circuit 47 is connected to the common line during the reading action, and detects the reading current flowing through the memory cell C that is selected when the reading voltage is applied via the selected bit line, for determining whether the memory element M of the selected memory cell is in the first state or in the second state.

The detailed circuit structure, device structure, and manufacturing method of the control circuit 42, the voltage generating circuit 43, the bit-line voltage application circuit 44, the first word-line voltage application circuit 45, and the second word-line voltage application circuit 46 can be realized by a known circuit structure, and can be realized by using a known semiconductor manufacturing technique. Therefore, the description will be omitted.

The non-volatile storage device 40 described above has the memory cell C that can perform writing with a small current and a low voltage. Therefore, the non-volatile storage device 40 has low power consumption, and can easily be made compact.

Fifth Embodiment

Figure 16:
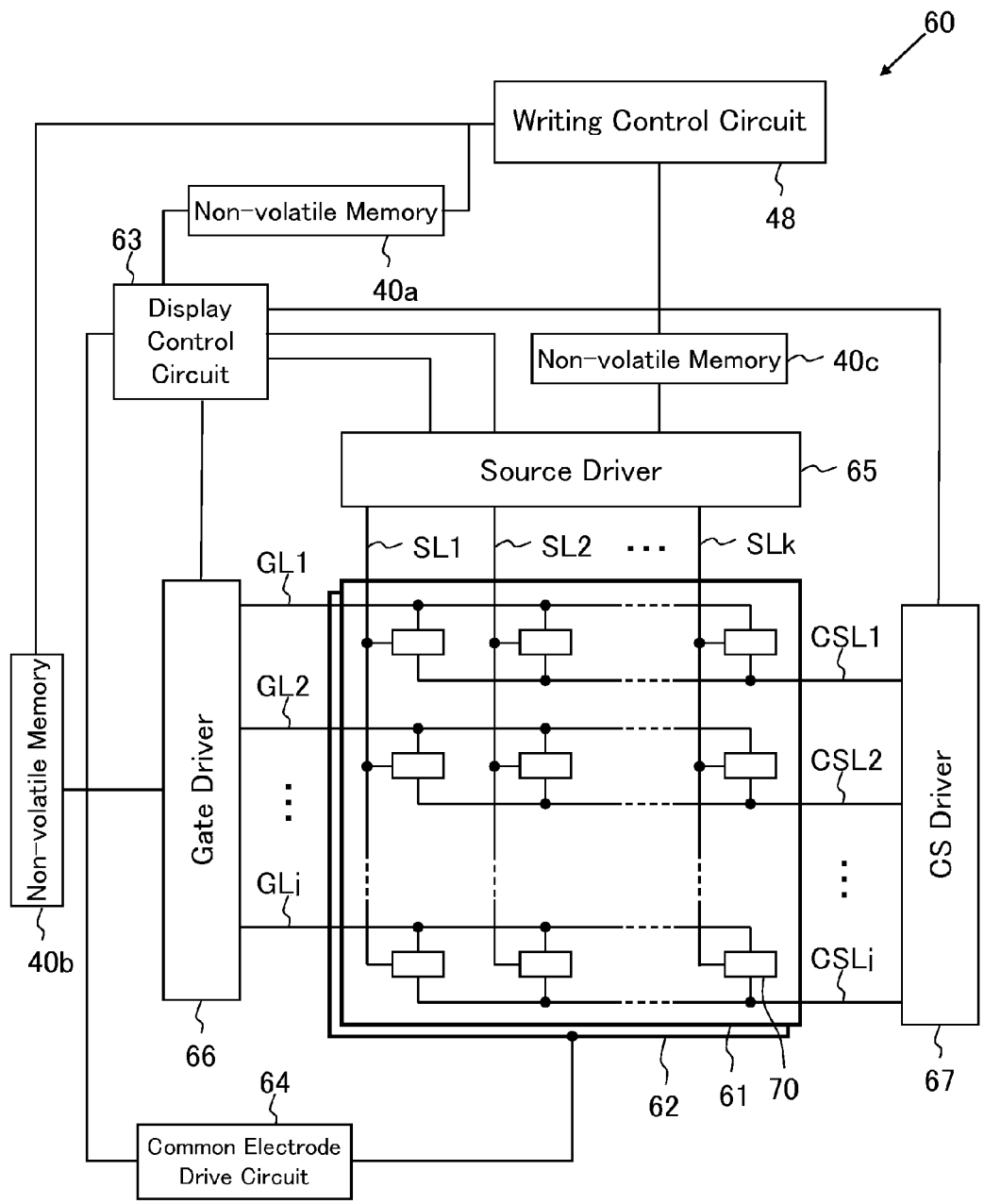
FIG. 16 is a circuit block diagram illustrating a configuration of a liquid crystal display device according to one embodiment of the present invention.

FIG. 16 illustrates an example in which the non-volatile storage device 40 is utilized for a liquid crystal display device. FIG. 16 is a circuit block diagram illustrating a schematic configuration of a liquid crystal display device 60 according to one embodiment of the present invention. As illustrated in FIG. 16, the liquid crystal display device 60 is configured by non-volatile memories 40a, 40b, and 40c, and a non-volatile memory writing control circuit 48, in addition to a conventional liquid crystal display device including an active matrix substrate 61, a common electrode 62, a display control circuit 63, a common electrode drive circuit 64, a source driver 65, a gate driver 66, and a CS driver 67.

Plural pixel circuits 70 are arranged in a row direction (in the horizontal direction in FIG. 16) and in a column direction (in the longitudinal direction in FIG. 16) on the active matrix substrate 61 to form a pixel circuit array. In the example in FIG. 16, j pixel circuits are arranged in the column direction, and k pixel circuits are arranged in the row direction, i.e., j×k pixel circuits (j and k each are natural integer) in total are arranged in a matrix, and the respective pixel circuits 70 are connected to one another by source lines SL1 to SLk, gate lines GL1 to GLj, and auxiliary capacitor lines CSL1 to CSLj. In FIG. 16, the pixel circuit 70 is illustrated as a block for avoiding the drawing from becoming complicated. In FIG. 16, the active matrix substrate 61 is illustrated above the common electrode 62 for the sake of convenience in order to explicitly indicate that various lines are formed on the active matrix substrate 61.

Figure 17:
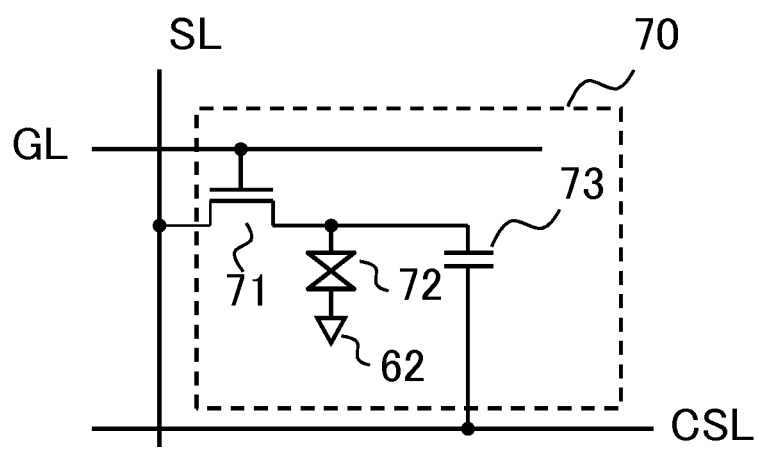
FIG. 17 is a circuit diagram illustrating an example of a configuration of a pixel circuit used in the liquid crystal display device.

FIG. 17 illustrates an example of a structure of the pixel circuit 70. The pixel circuit 70 includes a thin-film transistor 71, a liquid crystal capacitor 72, and an auxiliary capacitor 73. The thin-film transistor 71 is a transistor that serves as a switch depending upon a signal applied to the gate line. The gate line GL, the source line SL, and one ends of the liquid crystal capacitor 72 and the auxiliary capacitor 73 are respectively connected to a gate terminal, a source terminal, and a drain terminal of the thin-film transistor 71. The other end of the liquid crystal capacitor 72 is connected to the common electrode 62, and the other end of the auxiliary capacitor 73 is connected to an auxiliary capacitor line CSL.

Each of the non-volatile memories 40a, 40b, and 40c is constituted by the above-mentioned non-volatile storage device 40. The writing control circuit 48 controls the writing of each of the non-volatile memories 40a, 40b, and 40c. Each of the non-volatile memories 40a, 40b, and 40c can use the common voltage generating circuit 43. In the present embodiment, the control circuit 42 that controls each of the non-volatile memories and the common voltage generating circuit 43 are provided in the writing control circuit 48.

The non-volatile memory 40a stores configuration information, unique ID, and other information of a display panel. The information stored in the non-volatile memory 40a is referred to by the display control circuit 63, and a detailed display control method is switched based upon these information, or control parameters are optimized. The unique ID and other information can be referred to by a system connected to the display panel. These information can be utilized for determining the display panel or selecting an optimum driving method. The display control circuit 63 switches the circuit used for the display control, based upon the information stored in the non-volatile memory 40a, so as to realize the optimum display control.

The non-volatile memory 40b stores information about component parameters, such as redundancy relief information of a gate driver, necessary for driving the gate driver.

Similarly, the non-volatile memory 40c stores information about component parameters, such as redundancy relief information of a source driver, necessary for driving the source driver.

The detailed circuit structures and functions of the active matrix substrate 61, the common electrode 62, the display control circuit 63, the common electrode drive circuit 64, the source driver 65, the gate driver 66, and the CS driver 67 are substantially the same as those of a known liquid crystal display device, so that the detailed description thereof will be omitted.

Sixth Embodiment

As described above, the memory elements 1 and 3 to 6 operate as a transistor when they are in the first state before the writing, while they operate as a two-terminal resistance element when they are in the second state after the writing. Therefore, if the memory element is incorporated into a logic circuit, an output logical value for an input logical value of the logical circuit can be changed depending upon the state of the memory element.

Figure 18:
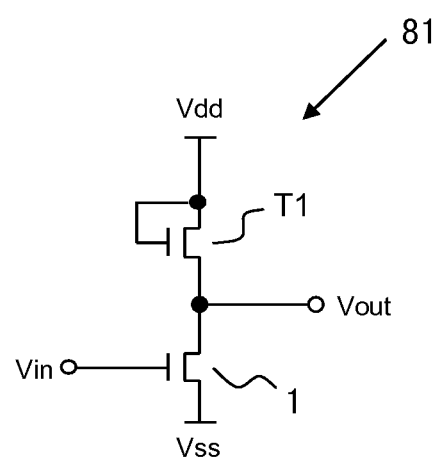
FIG. 18 is a circuit diagram illustrating an example in which a logic circuit is formed by using the memory element according to the present invention.

Examples in which the logic circuit is formed by using the memory elements 1 and 3 to 6 are illustrated in FIGS. 18 to 22. A memory circuit 81 illustrated in FIG. 18 is formed by replacing the transistor at one side constituting an inverter by the memory element 1. FIG. 19 illustrates a table of an output voltage Vout with respect to an input voltage Vin in a case where the memory element 1 is not written and in a case where the memory element 1 is written.

When the memory element 1 is not written (in the first state), the memory element 1 operates as a normal transistor. Therefore, when a high-level (H) voltage is applied to the gate terminal of the memory element 1 as Vin, the memory element 1 becomes an on state. In this case, the drain and the gate of the other transistor T1 are connected to the same power supply voltage Vdd, so that the transistor T1 is always in an on state. However, since the on resistance of the memory element 1 is set to be sufficiently smaller than the on resistance of the transistor T1, the output voltage Vout becomes Vss with low level (L). On the other hand, when a low-level (L) voltage is applied to the gate terminal of the memory element 1 as Vin, the memory element 1 becomes an off state. Therefore, the output voltage Vout becomes Vdd−Vth, considering a threshold voltage Vth of the transistor T1, so that a high-level (H) voltage is outputted.

However, after the memory element 1 is written to change the state thereof to the second state, the memory element 1 becomes the on state regardless of the voltage Vin applied to the gate terminal. Therefore, the output voltage Vout always becomes Vss with low level (L).

As a result, the output Vout of the inverter circuit can be fixed to a desired state by performing the writing to the memory element 1.

From another aspect, in FIG. 18, a series circuit of the memory element 1 and the transistor T1 can be regarded as the memory cell C having the transistor T1 as the selection transistor. The case in FIG. 18 is equivalent to the case where the selection transistor T1 is turned on, and the reading voltage Vdd–Vss is applied between both ends of the series circuit constituting the memory cell C. The low-level voltage is inputted to the gate terminal of the memory element 1 as Vin, and the voltage Vout of the connection node of the memory element 1 and the selection transistor T1 is detected, whereby the state of the memory element 1 can be determined from FIG. 19. Thus, the memory circuit can extract the information stored in the memory element 1 as a logical output without using a large-scale sense amplifier.

Figure 20:
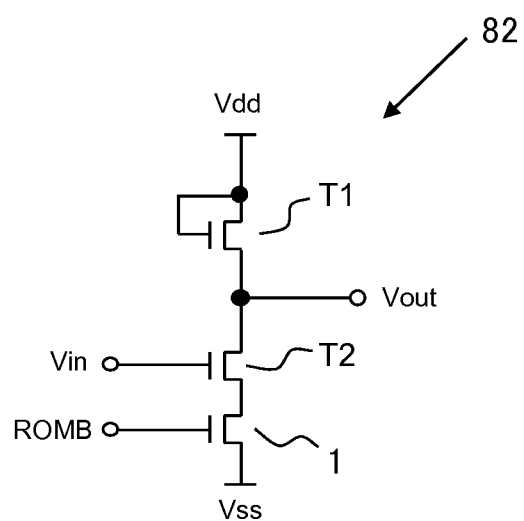
FIG. 20 is a circuit diagram illustrating an example in which a logic circuit is formed by using the memory element according to the present invention.

A memory circuit 82 illustrated in FIG. 20 is formed by inserting the memory element 1 according to the present invention into either one side (e.g., T2) of the transistor T1 and the transistor T2 composing the inverter. FIG. 21 illustrates a table of an output voltage Vout for an input voltage Vin and a voltage ROMB inputted to the gate electrode of the memory element 1 in the case where the memory element 1 is not written and in the case where the memory element 1 is written.

It is supposed that the voltage ROMB is high level (H). In this case, the memory element 1 has a low resistance between the source and the drain regardless of the memory state of the memory element 1, so that the memory circuit 82 operates as a normal inverter circuit. When the input voltage Vin is low level (L), the output voltage Vout becomes Vdd–Vth considering the threshold voltage Vth of the transistor T1, which means the output voltage Vout is changed to a high level (H), while the output voltage Vout is changed to the low level (L) when the input voltage Vin is high level (H).

On the other hand, it is supposed that the voltage ROMB is low level (L). In this case, when the memory element 1 is in the first state before the writing, the memory element 1 is in the off state. However, when the memory element 1 is written to be changed to the second state, the memory element 1 has a low resistance between the source and the drain. Therefore, the output voltage Vout is switched depending upon the memory state of the memory element 1 by setting the input voltage Vin to be a high level (H) and turning on the transistor T2.

Specifically, the memory circuit 82 can fix the output Vout of the inverter to a voltage corresponding to the memory state of the memory element 1 by setting the input voltage Vin to be a high level (H) and setting the voltage ROMB to be a low level (L). Thus, like the logic circuit 81, the memory circuit 82 can extract the information stored in the memory element 1 as a logical output without using a large-scale sense amplifier.

Figure 22:
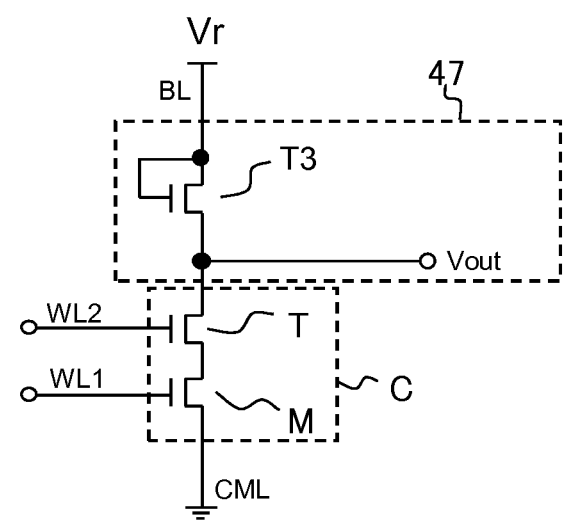
FIG. 22 is a circuit diagram illustrating an example in which the logic circuit using the memory element according to the present invention is used for reading of a non-volatile storage device.

FIG. 22 illustrates an example in which the memory circuit 82 is used for the reading of the above-mentioned non-volatile storage device 40. The series circuit of the transistor T2 and the memory element 1 illustrated in FIG. 20 is equivalent to the memory cell C including the selection transistor T and the memory element M connected in series in FIG. 15. In this case, the voltage ROMB corresponds to the voltage applied to the selected first word line WL1, and the input voltage Vin corresponds to the voltage applied to the selected second word line WL2. It is supposed that one end, which is not connected to the selection transistor T, of the memory element M is connected to the common line CML, and one end, which is not connected to the memory element M, of the selection transistor T is connected to the selected bit line BL.

When the selected memory cell C is read, as described above, a low-level off voltage is applied to the gate terminal of the memory element M via the selected first word line WL1, and a high-level voltage for turning on the selection transistor T is applied to the gate of the selection transistor T via the selected second word line WL2. The common line is set to have a predetermined potential (e.g., ground potential), and the reading voltage Vr is applied to the selected bit line BL to perform the reading. In this case, the determination circuit 47 including a transistor T3 (corresponding to the transistor T1 in FIG. 20) is inserted from the selected bit line BL side for detecting the voltage Vout of the connection node of the transistor T3 and the memory cell C. When the Vout is high level, it can be determined that the memory element M is in the first state. When the Vout is low level, it can be determined that the memory element M is in the second state after the writing.

Thus, the memory circuit 82 can extract the information stored in the memory element by detecting the voltage without using a large-scale sense amplifier as the determination circuit 47.

In FIG. 22, the transistor T3 used for determining the memory state of the memory element M can only distribute the reading voltage Vr applied to the bit line. Therefore, the transistor T3 may be replaced by a two-terminal resistance.

In FIGS. 18 and 20, the transistor T1 connected to the high-level power supply voltage Vdd is used as a load circuit, so that the drain and the gate thereof is short-circuited. However, another fixed voltage different from the Vdd may be applied to the gate terminal in order to attain an optimum on resistance. The memory element 1 may be any one of the memory elements 3 to 6. The transistors T1 to T3 may have the structure same as the structure of the memory element 1 or memory elements 3 to 6 according to the present invention. In such case, the memory state of the transistor T1 or T2 as the memory element is fixed to the first state. In FIGS. 18 and 20, wirings and circuits required for the writing are omitted.

Seventh Embodiment

Figure 23:
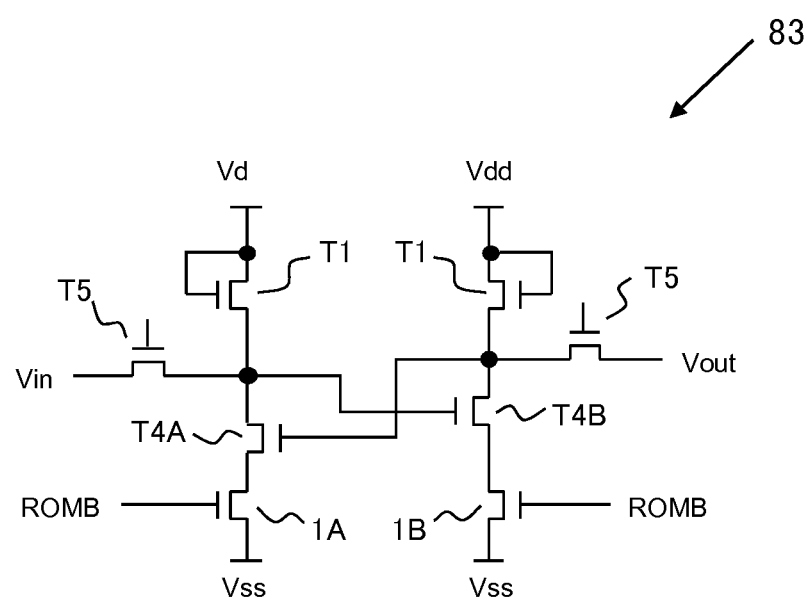
FIG. 23 is a circuit diagram illustrating an example in which a logic circuit is formed by using the memory element according to the present invention.

FIG. 23 illustrates another example in which a memory circuit is formed by using the memory element (memory transistor) according to the present invention. A memory circuit 83 illustrated in the circuit diagram in FIG. 23 is an example in which the memory element 1 (1A, 1B) according to the present invention is incorporated in a SRAM circuit. In the present embodiment, the memory circuit is configured such that writing is performed to either one of the memory elements 1A and 1B, and information is held in a non-volatile manner by confirming which one of the memory elements 1A and 1B is written. FIG. 24 illustrates a table of an output voltage Vout with respect to an input voltage Vin and a voltage ROMB inputted to the gates of the memory elements 1A and 1B in a case where the memory element 1B is written and in a case where the memory element 1B is not written.

As illustrated in FIG. 23, a memory circuit 83 includes two sets of series circuits, each circuit including a transistor T1, a transistor T4 (T4A or T4B), and a memory element 1 (1A or 1B), and forms a SRAM circuit in which a gate of one of the transistors T4A and T4B and a drain of the other transistor are connected to each other.

The series circuit has a structure same as that of the above-mentioned memory circuit 82. Therefore, in the state in which the reading gate transistor T5 in FIG. 23 is in an on state, the output voltage Vout changes as illustrated in FIG. 24, similarly as in FIG. 21, depending upon the input voltage Vin, the voltage ROMB, and the memory state of the memory element 1B. When the reading gate transistor T5 is then turned off, the memory state can be held as the state of the voltage applied to the gate terminal of each of the transistors T4A and T4B.

The memory circuit 83 is used with the voltage ROMB set as a high level (H) during a normal use. In this case, the memory circuit 83 operates in the same manner as the normal SRAM element, regardless of the memory state of the memory elements 1A and 1B.

It is supposed here that a voltage with a low level (L) is held on the gate terminal of the transistor T4A and a voltage with a high level (H) is held on the gate terminal of the transistor T4B. It is also supposed that the memory element 1A is written, and the memory element 1B is not written. When the voltage ROMB is set as a low level (L) with the reading gate transistor T5 being turned off with this state, since the memory element 1A has a low resistance, but since the memory element 1B is in an off state, the voltage on the connection node of the memory element 1B and the transistor T4B increases, so that the voltage on the gate terminal of the transistor T4A increases. Accordingly, the voltage on the connection node of the memory element 1A and the transistor T4A decreases, with the result that the voltage on the gate terminal of the transistor T4A is changed to a high level (H), and the voltage on the gate terminal of the transistor T4B is changed to a low level (L).

On the other hand, it is supposed here that a voltage with a high level (H) is held on the gate terminal of the transistor T4A and a voltage with a low level (L) is held on the gate terminal of the transistor T4B. It is also supposed that the memory element 1A is not written, and the memory element 1B is written. When the voltage ROMB is set as a low level (L) with the reading gate transistor T5 being turned off with this state, since the memory element 1B has a low resistance, but since the memory element 1A is in an off state, the voltage on the connection node of the memory element 1A and the transistor T4A increases, so that the voltage on the gate terminal of the transistor T4B increases. Accordingly, the voltage on the connection node of the memory element 1B and the transistor T4B decreases, with the result that the voltage on the gate terminal of the transistor T4A is changed to a low level (L), and the voltage on the gate terminal of the transistor T4B is changed to a high level (H).

Specifically, in the memory circuit 83, the memory state of the SRAM circuit is changed to the one reflecting the memory states of the memory elements 1A and 1B by setting the ROMB as the low level (L) with the reading gate transistor T5 in FIG. 23 being turned off, and when the ROMB is then set as the high level (H), the memory state of the SRAM circuit changes to a normal SRAM data holding mode with the memory states of the memory elements 1A and 1B being copied. When the reading action is performed to the SRAM circuit with this state, the normal reading action is executed, and when the writing action is performed, the normal writing action is executed.

Accordingly, the memory circuit 83 can be used as a normal SRAM element after the memory states of the memory elements 1A and 1B are copied into the SRAM circuit in the memory circuit 83 just after the power is turned on or just after the power is returned from the power off.

In FIG. 23, the memory elements 1A and 1B may be any one of the memory elements 3 to 6. In addition, the transistors T1, T4A, T4B, and T5 may have the structure same as that of the memory element 1 or the memory elements 3 to 6 according to the present invention. In this case, the memory state of the transistors T1, T4A, T4B, and T5 as the memory element is fixed to the first state. The transistor T1 connected to the high-level power supply voltage Vdd has a drain and a gate which are short-circuited, since it is used as a load circuit. However, a fixed voltage different from the Vdd may be applied to the gate terminal in order to realize an optimum on resistance.

Figure 25:
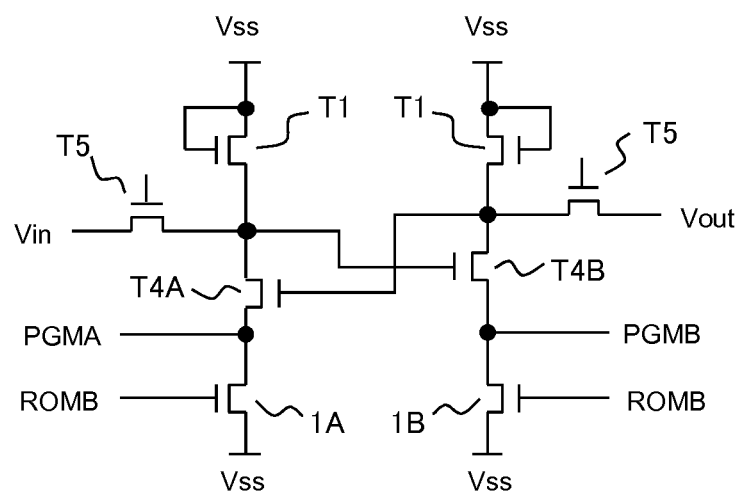
FIG. 25 is a diagram illustrating a writing method of the memory element in the logic circuit formed by using the memory element according to the present invention.

FIG. 25 illustrates a method of writing the memory element 1A or 1B in the memory circuit 83 in FIG. 23. FIG. 25 additionally illustrates wirings to be connected to the drains of the memory elements 1A and 1B and to apply writing voltages PGMA and PGMB, to the memory circuit 83 shown in FIG. 23.

When either one of the memory elements 1A and 1B in FIG. 25 is written, the voltage applied to the drain of the transistor T1 is changed from Vdd to Vss, the transistor T5 is turned on, and low-level voltages applied as Vin and Vout. Thus, the gates of the transistors T4A and T4B each have a low level, so that the transistors T4A and T4B are in the off state.

Thereafter, the writing voltage Vpp is applied to the drain and the gate of the memory element that is to be written. For example, when the writing is performed to the memory element 1A, the writing voltage Vpp serving as the voltage ROMB is applied to the gate of the memory element 1A, and the writing voltage Vpp serving as the voltage PGMA is applied to the drain of the memory element 1A. On the other hand, a low-level voltage as the voltage PGMB is applied to the drain of the memory element 1B to which the writing is not performed, or a voltage is not applied to set the drain of the memory element 1B as a floating state.

With this, the writing of the memory element 1A or 1B can be executed.

Figure 26:
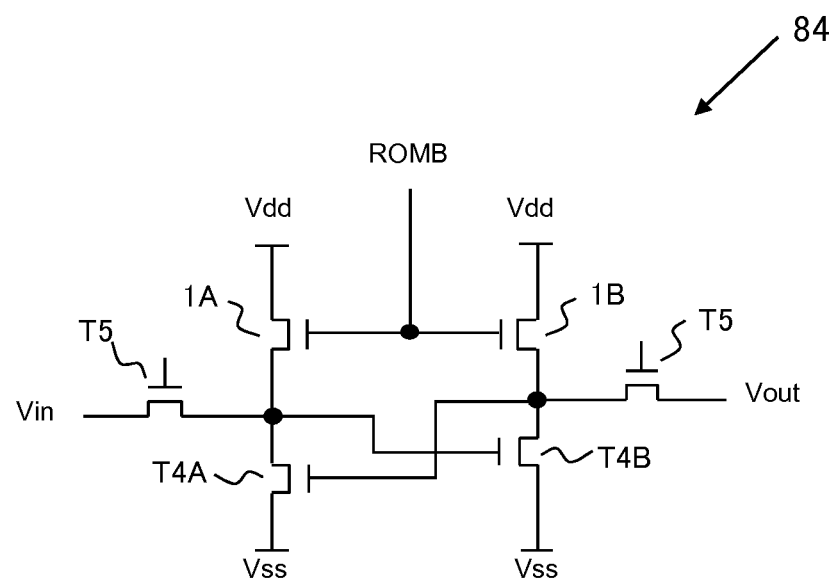
FIG. 26 is a circuit diagram illustrating an example in which a logic circuit is formed by using the memory element according to the present invention.

FIG. 26 illustrates another example in which the memory element 1 (1A, 1B) according to the present invention is incorporated into the SRAM circuit. A memory circuit 84 illustrated by a circuit diagram in FIG. 26 is configured such that the memory element 1 (1A, 1B) is connected to a high-potential side relative to the transistor T4 (T4A, T4B) forming the SRAM circuit to form a series circuit including the memory element 1A and the transistor T4A and a series circuit including the memory element 1B and the transistor T4B. In the present embodiment, writing is performed to either one of the memory elements 1A and 1B in the memory circuit 84, and holds information in a non-volatile manner as to which one of the memory elements 1A and 1B is written.

The memory circuit 84 is used with the voltage ROMB set as a high level (H) during a normal use. In this case, since the memory elements 1A and 1B in FIG. 26 operate as a load circuit like the transistor T1 including the drain and the gate that are short-circuited in the memory circuit 83 in FIG. 23, the memory circuit 84 operates in the same manner as the normal SRAM element, regardless of the memory state of the memory elements 1A and 1B.

It is supposed here that a voltage with a low level (L) is held on the gate terminal of the transistor T4A and a voltage with a high level (H) is held on the gate terminal of the transistor T4B. It is also supposed that the memory element 1B is written, and the memory element 1A is not written. When the voltage ROMB is set as a low level (L) with the reading gate transistor T5 being turned off with this state, since the memory element 1B has a low resistance, but since the memory element 1A is in an off state, the voltage on the connection node of the memory element 1A and the transistor T4A decreases, so that the voltage on the gate terminal of the transistor T4B decreases. Accordingly, the voltage on the connection node of the memory element 1B and the transistor T4B increases, with the result that the voltage on the gate terminal of the transistor T4A is changed to a high level (H), and the voltage on the gate terminal of the transistor T4B is changed to a low level (L).

On the other hand, it is supposed here that a voltage with a high level (H) is held on the gate terminal of the transistor T4A and a voltage with a low level (L) is held on the gate terminal of the transistor T4B. It is also supposed that the memory element 1B is not written, and the memory element 1A is written. When the voltage ROMB is set as a low level (L) with the reading gate transistor T5 being turned off with this state, the memory element 1A has a low resistance, but since the memory element 1B is in an off state, the voltage on the connection node of the memory element 1B and the transistor T4B decreases, so that the voltage on the gate terminal of the transistor T4A decreases. Accordingly, the voltage on the connection node of the memory element 1A and the transistor T4A increases, with the result that the voltage on the gate terminal of the transistor T4A is changed to a high level (H), and the voltage on the gate terminal of the transistor T4B is changed to a low level (L).

Specifically, in the memory circuit 84, the memory state of the SRAM circuit is changed to the one reflecting the memory states of the memory elements 1A and 1B by setting the ROMB as the low level (L) with the reading gate transistor T5 in FIG. 26 being turned off, and when the ROMB is then set as the high level (H), the memory state of the SRAM circuit changes to a normal SRAM data holding mode with the memory states of the memory elements 1A and 1B being copied, as in the memory circuit 83 illustrated in FIG. 23. When the reading action is performed to the SRAM circuit with this state, the normal reading action is executed, and when the writing action is performed, the normal writing action is executed.

Accordingly, the memory circuit 84 can be used as a normal SRAM element after the memory states of the memory elements 1A and 1B are copied into the SRAM circuit in the memory circuit 84 just after the power is turned on or just after the power is returned from the power off.

In FIG. 26, the memory elements 1A and 1B may be any one of the memory elements 3 to 6. In addition, the structure of each of the transistors T4A, T4B, and T5 may be same as that of the memory element 1 or the memory elements 3 to 6 according to the present invention. In this case, the memory states of the transistors T4A, T4B, and T5 as the memory element are fixed to the first state.

When the writing of the memory element 1A or 1B is performed in the memory circuit 84 described above, a logical state reverse to the memory state of the SRAM circuit corresponding to the writing states of the memory elements 1A and 1B is preliminarily held in the SRAM circuit. Here, the logical state reverse to the memory state of the SRAM circuit means the holding state reverse to the holding state of the SRAM circuit generated when the voltage ROMB is set as a low level (L) with the reading gate transistor T5 being turned off, if the memory element 1A or 1B were written in a desired state.

Thereafter, the voltage ROMB and the power supply voltage Vdd are increased from the high level (H) to a higher writing voltage Vpp with the reading gate transistor T5 being turned off, whereby the writing is performed.

Figure 27:
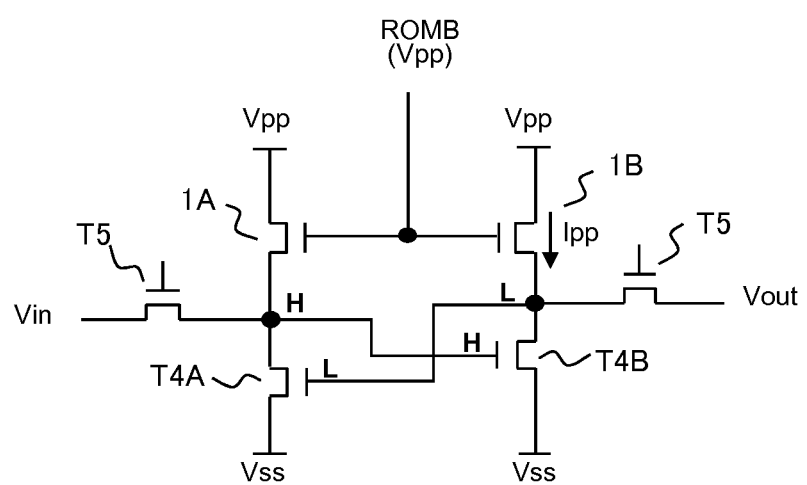
FIG. 27 is a diagram illustrating a writing method of the memory element in the logic circuit formed by using the memory element according to the present invention.

FIG. 27 illustrates a method of writing the memory element 1B in the memory circuit 84 illustrated in FIG. 26, as an example. In FIG. 26, a low-level (L) voltage is held on the gate terminal of the transistor T4A, and a high-level (H) voltage is applied to the gate terminal of the transistor T4B.

When the voltage ROMB and the power supply voltage Vdd are increased up to the writing voltage Vpp with this state, the series circuit including the memory element 1B and the transistor T4B are made conductive, so that the voltage on the gate terminal of the transistor T4A is decreased to near Vss. Thus, the voltage close to the writing voltage Vpp is applied between the drain and the source of the memory element 1B, and the voltage close to the writing voltage Vpp is similarly applied between the gate and the source, whereby the memory element 1B is written. On the other hand, the voltage applied to the gate terminal of the transistor T4B increases up to almost Vpp, and the voltage sufficiently low enough to inhibit the writing of the memory element 1A is applied between the drain and the source of the memory element 1A, whereby the memory element 1A is not written.

As described above, a memory circuit that can perform writing with a small current and a low voltage, i.e., with reduced power consumption, and a driving method of the memory circuit can be realized by using the memory element (memory transistor) according to the present invention. A non-volatile storage device that can easily realize a reduction in a chip size can be realized by using the memory circuit as a memory cell. In addition, a liquid crystal display device utilizing the non-volatile storage device according to the present invention can be realized. Further, a memory circuit that can change a combination of an output logical value and an input logical value depending upon the memory state of the memory element can be realized by incorporating the memory element according to the present invention into a logic circuit.

Other Embodiments

Other embodiments will be described below.

Figure 28A:
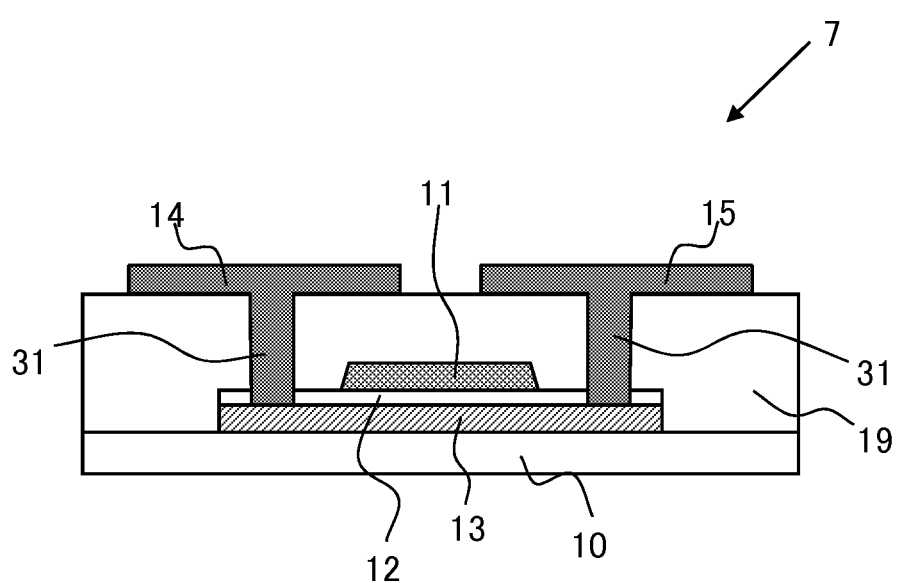
FIGS. 28A and 28B are a sectional view illustrating a structure of a memory element according to another embodiment of the present invention, and an example of a layout on a top surface of the memory element, respectively.
Figure 28B:
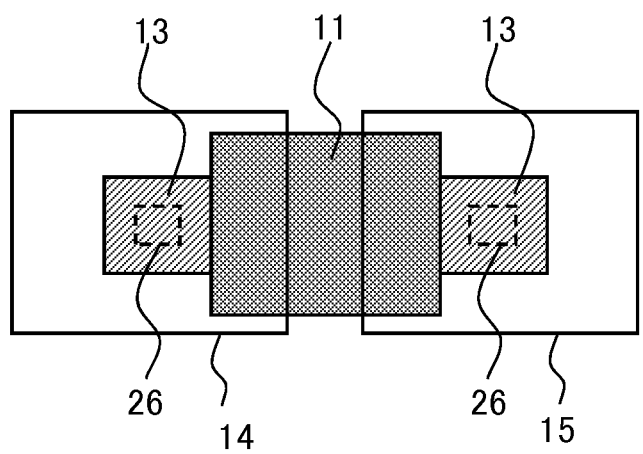

(1) The embodiments described above illustrate the case in which the transistor structure of the memory element includes a bottom gate thin-film transistor. However, the present invention is not limited thereto. For example, FIG. 28 illustrates an example in which the present invention is applied to a top gate thin-film transistor. FIG. 28A schematically illustrates a sectional view of a structure of a memory element 7 according to the other embodiment of the present invention. FIG. 28B illustrates a layout example of a top surface of the memory element 7. A metal oxide semiconductor layer 13, a gate insulating film 12, and a gate electrode 11 are successively formed on a glass substrate 10, and a source electrode 14 and a drain electrode 15 formed on an insulating film 19 are connected to the metal oxide semiconductor layer 13 via a contact opening 31 formed in a contact opening formation region (a region 26 in FIG. 28B).

It is preferable that the channel width is set as narrow as possible in order to increase a density of a current flowing through the metal oxide semiconductor layer 13 in the channel region during the writing. It is also preferable that that gate electrode is arranged such that the width of the region of the gate electrode 11 overlapping with the metal oxide semiconductor layer 13 is decreased, i.e., the channel length becomes short, in order to effectively increase the temperature of the metal oxide semiconductor layer 13 in the channel region by Joule heat.

Similarly, a memory element including a MOS transistor structure can be formed by forming the metal oxide semiconductor layer 13 on a silicon substrate.

(2) The fourth embodiment illustrates the case in which the common lines extend in the column direction in the memory cell array 41. However, the present invention is not limited thereto. The common lines may extend in the row direction. It may also be configured such that one end of each memory cell C not connecting to the bit line is connected to the same fixed potential (e.g., the ground potential). This case is equivalent to the case in which the common line connected to the one end of the memory cell C is common for all memory cells.

(3) In the fourth embodiment, the determination circuit 47 is provided on the common line side to detect a current flowing from the selected bit line to the common line on the common line side. However, it can be configured such that, during the reading, the determination circuit 47 is provided on the bit line side to detect a current flowing from the selected bit line to the common line on the bit line side. As described in the sixth embodiment, it can also be configured such that the determination circuit 47 including a resistance element is provided on the bit line side to detect a voltage change caused by a flow of a reading current flowing from the selected bit line to the common line.

(4) In the fourth embodiment, the non-volatile storage device 40 can be realized by including any one of the memory elements 1 and 3 to 7 according to the present invention, and the present invention is not limited by the structure of the memory cell array 41, and the circuit structures of the other control circuits and the voltage application circuit. Similarly, in the fifth embodiment, the liquid crystal display device 60 can be realized by including a non-volatile memory that includes the memory element according to the present invention. The present invention is not limited by the structures of the display control circuit 63 and the pixel circuit 70 in the liquid crystal display device 60.

(5) In the embodiments described above, the selection transistor T or the transistors T1 to T5 forming the logic circuit are N-channel transistors in the description of the operation of the memory cell or in the description of the operation of the logic circuit. However, these transistors may be P-channel transistors when they are formed on a silicon substrate with a CMOS process.

INDUSTRIAL APPLICABILITY

The present invention is applicable to a memory circuit, particularly to a non-volatile storage device that stores information by using a memory element. The memory circuit can be used as a logic circuit that can change a combination of an output logical value and an input logical value depending upon the memory state of the memory element by incorporating the memory element inside.

EXPLANATION OF REFERENCES 1, 3-7, M memory element according to the present invention
2, C memory cell (memory circuit) according to the present invention
10 substrate
11 gate electrode
12 gate insulating film
13 metal oxide semiconductor layer
14 source electrode
15 drain electrode
16 channel etch stopper layer
17 passivation layer
18 insulating material layer (oxygen absorption layer)
19 insulating film
26 contact opening formation region
31 contact opening
40 non-volatile storage device according to the present invention
40a, 40b, 40c non-volatile memory
41 memory cell array
42 control circuit
43 voltage generating circuit
44 bit-line voltage application circuit
45 first word-line voltage application circuit
46 second word-line voltage application circuit
47 determination circuit
48 writing control circuit
60 liquid crystal display device according to the present invention
61 active matrix substrate
62 common electrode
63 display control circuit
64 common electrode drive circuit
65 source driver
66 gate driver
67 CS driver
70 pixel circuit
71 thin-film transistor
72 liquid crystal capacitor
73 auxiliary capacitor
81-84 logic circuit (memory circuit) according to the present invention
BL, BL1-BLn bit line of non-volatile storage device
CML, CML1-CMLn common line of non-volatile storage device
CSL, CSL1-CSLj auxiliary capacitor line of liquid crystal display device
GL, GL1-GLj gate line of liquid crystal display device
Ipp writing current
Ir reading current
SL, SL1-SLk source line of liquid crystal display device
T selection transistor
T1-T5 transistor
Vd drain voltage
Vdd high-level power supply voltage
Vds voltage between source and drain
Vg gate voltage
Vgs voltage between gate and source
Vin input voltage of logic circuit
Vout output voltage of logic circuit
Vpp writing voltage
Vs source voltage
Vss low-level power supply voltage
WL1, WL11-WL1*m* first word line of non-volatile storage device
WL2, WL21-WL2*m* second word line of non-volatile storage device

The invention claimed is:

1. A memory circuit comprising a memory transistor having a transistor structure, the transistor structure including
a source electrode, a drain electrode, and a gate electrode; and
a source region, a drain region and a channel region each configured by a metal oxide semiconductor, wherein
the memory transistor holds either one of a first state and a second state in a non-volatile manner, the first state indicating that a current flows depending upon a voltage application state of the source electrode and the drain electrode of the transistor structure with a current-voltage characteristic depending upon a voltage application state of the gate electrode of the transistor structure, and the second state indicating an ohmic resistance property relative to a voltage applied to the source electrode and the drain electrode, regardless of the voltage application state of the gate electrode,
the resistance property between the source and the drain region transitions to a lower resistance, and the state of the memory transistor is changed from the first state to the second state by the current flowing between the source region and the drain region of the transistor structure, and a channel length of the transistor structure is smaller than the width of the gate electrode extending at an outside of the channel region.

2. The memory circuit according to claim 1, wherein the metal oxide semiconductor is formed by containing IGZO (InGaZnOx).

3. The memory circuit according to claim 1, wherein the transistor structure includes, in the vicinity of the channel region, an oxygen absorption layer to fix oxygen, which has moved to an outside of the channel region in the metal oxide semiconductor.

4. The memory circuit according to claim 1, wherein the transistor structure includes a channel narrow region by which a density of a current flowing between the source region and the drain region becomes the maximum.

5. The memory circuit according to claim 1, comprising:
a series circuit formed by connecting two of the memory transistors in series, wherein
one of the memory transistors forms a memory element, and the other memory transistor forms a selection transistor, and
a state of the memory transistor forming the selection transistor is fixed to the first state.

6. The memory circuit according to claim 1, comprising:
a series circuit formed by connecting a memory element formed by the memory transistor to a load circuit in series, wherein
one end of the series circuit is connected to a high-level reference voltage, and the other end is connected to a low-level reference voltage, and
a voltage outputted on a connection node of the memory element and the load circuit is changed in accordance with a voltage inputted to the gate electrode of the memory element.

7. The memory circuit according to claim 1, wherein
one end of a series circuit in which a memory element formed by the memory transistor is connected to a switching transistor in series and one end of a load circuit are connected to each other,
one of the other end of the series circuit and the other end of the load circuit is connected to a high-level reference voltage, and the other is connected to a low-level reference voltage, and
a voltage outputted on a connection node of the series circuit and the load circuit is changed in accordance with a voltage inputted to the gate electrode of the memory element and a gate voltage inputted to the switching transistor.

8. The memory circuit according to claim 1, comprising:
two sets of series circuits in which a switching transistor is connected in series to a memory element formed by the memory transistor; and
a SRAM circuit in which a drain terminal of the switching transistor of one of the series circuits and a gate terminal of the switching transistor of the other series circuit are connected to each other, wherein
a memory state of the SRAM circuit is changed to a memory state held in the memory element by applying, to the gate electrode of the memory element, as an input, a low-level voltage by which the transistor structure becomes in an off state if the memory element is in the first state.

9. A memory circuit, comprising a memory transistor having a transistor structure, the transistor structure including
a source electrode, a drain electrode, and a gate electrode; and
a source region, a drain region and a channel region each configured by a metal oxide semiconductor, wherein
the memory transistor holds either one of a first state and a second state in a non-volatile manner, the first state indicating that a current flows depending upon a voltage application state of the source electrode and the drain electrode of the transistor structure with a current-voltage characteristic depending upon a voltage application state of the gate electrode of the transistor structure, and the second state indicating an ohmic resistance property relative to a voltage applied to the source electrode and the drain electrode, regardless of the voltage application state of the gate electrode,
the resistance property between the source and the drain region transitions to a lower resistance, and the state of the memory transistor is changed from the first state to the second state by the current flowing between the source region and the drain region of the transistor structure,
the memory circuit further comprising a series circuit formed by connecting two of the memory transistors in series,
one of the memory transistors forms a memory element and the other memory transistor forms a selection transistor,
a state of the memory transistor forming the selection transistor is fixed to the first state, and
a ratio of a channel width to a channel length of the memory transistor forming the selection transistor is larger than a ratio of a channel width to a channel length of the memory transistor forming the memory element.

10. The memory circuit according to claim 9, wherein the metal oxide semiconductor is formed by containing IGZO (InGaZnOx).

11. The memory circuit according to claim 9, wherein the transistor structure includes, in the vicinity of the channel region, an oxygen absorption layer to fix oxygen, which has moved to an outside of the channel region in the metal oxide semiconductor.

12. The memory circuit according to claim 9, wherein the transistor structure includes a channel narrow region by which a density of a current flowing between the source region and the drain region becomes the maximum.

13. The memory circuit according to claim 9, comprising:
a series circuit formed by connecting a memory element formed by the memory transistor to a load circuit in series, wherein
one end of the series circuit is connected to a high-level reference voltage, and the other end is connected to a low-level reference voltage, and
a voltage outputted on a connection node of the memory element and the load circuit is changed in accordance with a voltage inputted to the gate electrode of the memory element.

14. The memory circuit according to claim 9, wherein
one end of a series circuit in which a memory element formed by the memory transistor is connected to a switching transistor in series and one end of a load circuit are connected to each other,
one of the other end of the series circuit and the other end of the load circuit is connected to a high-level reference voltage, and the other is connected to a low-level reference voltage, and a voltage outputted on a connection node of the series circuit and the load circuit is changed in accordance with a voltage inputted to the gate electrode of the memory element and a gate voltage inputted to the switching transistor.

15. The memory circuit according to claim 9, comprising:
two sets of series circuits in which a switching transistor is connected in series to a memory element formed by the memory transistor; and
a SRAM circuit in which a drain terminal of the switching transistor of one of the series circuits and a gate terminal of the switching transistor of the other series circuit are connected to each other, wherein
a memory state of the SRAM circuit is changed to a memory state held in the memory element by applying, to the gate electrode of the memory element, as an input, a low-level voltage by which the transistor structure becomes in an off state if the memory element is in the first state.

16. A memory circuit, comprising a memory transistor having a transistor structure, the transistor structure including
a source electrode, a drain electrode, and a gate electrode; and
a source region, a drain region and a channel region each configured by a metal oxide semiconductor, wherein
the memory transistor holds either one of a first state and a second state in a non-volatile manner, the first state indicating that a current flows depending upon a voltage application state of the source electrode and the drain electrode of the transistor structure with a current-voltage characteristic depending upon a voltage application state of the gate electrode of the transistor, and the second state indicating an ohmic resistance property relative to a voltage applied to the source electrode and the drain electrode, regardless of the voltage application state of the gate electrode,
the resistance property between the source and the drain region transitions to a lower resistance, and the state of the memory transistor is changed from the first state to the second state by the current flowing between the source region and the drain region of the transistor structure,
the memory circuit further comprising a series circuit formed by connecting two of the memory transistors in series,
one of the memory transistors forms a memory element, and the other memory transistor forms a selection transistor,
a state of the memory transistor forming the selection transistor is fixed to the first state, and
a threshold voltage of the memory transistor forming the selection transistor in the first state is lower than a threshold voltage of the memory transistor forming the memory element in the first state.

17. The memory circuit according to claim 16, wherein the metal oxide semiconductor is formed by containing IGZO (InGaZnOx).

18. The memory circuit according to claim 16, wherein the transistor structure includes, in the vicinity of the channel region, an oxygen absorption layer to fix oxygen, which has moved to an outside of the channel region in the metal oxide semiconductor.

19. The memory circuit according to claim 16, wherein the transistor structure includes a channel narrow region by which a density of a current flowing between the source region and the drain region becomes the maximum.

20. The memory circuit according to claim 16, comprising:
a series circuit formed by connecting a memory element formed by the memory transistor to a load circuit in series, wherein
one end of the series circuit is connected to a high-level reference voltage, and the other end is connected to a low-level reference voltage, and
a voltage outputted on a connection node of the memory element and the load circuit is changed in accordance with a voltage inputted to the gate electrode of the memory element.

21. The memory circuit according to claim 16, wherein
one end of a series circuit in which a memory element formed by the memory transistor is connected to a switching transistor in series and one end of a load circuit are connected to each other,
one of the other end of the series circuit and the other end of the load circuit is connected to a high-level reference voltage, and the other is connected to a low-level reference voltage, and
a voltage outputted on a connection node of the series circuit and the load circuit is changed in accordance with a voltage inputted to the gate electrode of the memory element and a gate voltage inputted to the switching transistor.

22. The memory circuit according to claim 16, comprising:
two sets of series circuits in which a switching transistor is connected in series to a memory element formed by the memory transistor; and
a SRAM circuit in which a drain terminal of the switching transistor of one of the series circuits and a gate terminal of the switching transistor of the other series circuit are connected to each other, wherein
a memory state of the SRAM circuit is changed to a memory state held in the memory element by applying, to the gate electrode of the memory element, as an input, a low-level voltage by which the transistor structure becomes in an off state if the memory element is in the first state.

23. A method of driving a memory circuit, comprising a memory transistor having a transistor structure, the transistor structure including
a source electrode, a drain electrode, and a gate electrode; and
a source region, a drain region and a channel region each configured by a metal oxide semiconductor, wherein
the memory transistor holds either one of a first state and a second state in a non-volatile manner, the first state indicating that a current flows depending upon a voltage application state of the source electrode and the drain electrode of the transistor structure with a current-voltage characteristic depending upon a voltage application state of the gate electrode of the transistor structure, and the second state indicating an ohmic resistance property relative to a voltage applied to the source electrode and the drain electrode, regardless of the voltage application state of the gate electrode,
the resistance property between the source and the drain region transitions to a lower resistance, and the state of the memory transistor is changed from the first state to the second state by the current flowing between the source region and the drain region of the transistor structure, the memory circuit further comprising a series circuit formed by connecting two of the memory transistors in series, one of the memory transistors forms a memory element and the other memory transistor forms a selection transistor, and a state of the memory transistor forming the selection transistor is fixed to the first state, the method comprising:

a step of turning on the memory transistor by applying a predetermined voltage to the gate electrode of the memory transistor that forms the memory element in the first state;

a step of applying a voltage, which is necessary for writing to change the memory transistor from the first state to the second state, between the drain electrode and the source electrode of the memory transistor forming the memory element; and a step of turning on the memory transistor forming the selection transistor by applying a predetermined voltage to the gate electrode.

24. The method of driving the memory circuit according to claim 23, wherein at the time when the voltage necessary for the writing is applied to the memory transistor forming the memory element, the voltage applied to the gate electrode of the memory transistor forming the selection transistor relative to the voltage of the source electrode is higher than the voltage applied to the gate electrode of the memory transistor forming the memory element relative to the voltage of the source electrode.

25. The method of driving the memory circuit according to claim 24, wherein the drain electrode of the memory transistor forming the memory element and serving as one end of the series circuit is connected to a higher voltage side than the source electrode of the memory transistor forming the selection transistor and serving as the other end of the series circuit, and the voltage applied to the gate electrode of the memory transistor forming the selection transistor is the same as the voltage applied to the gate electrode of the memory transistor forming the memory element.

* * * * *